United States Patent
Burssens et al.

(10) Patent No.: US 11,527,705 B2
(45) Date of Patent: Dec. 13, 2022

(54) SEMICONDUCTOR DEVICE COMPRISING PASSIVE MAGNETOELECTRIC TRANSDUCER STRUCTURE

(71) Applicant: Melexis Bulgaria Ltd., Sofia (BG)

(72) Inventors: Jan-Willem Burssens, Tielt-Winge (BE); Javier Bilbao de Mendizabal, Zurich (CH)

(73) Assignee: MELEXIS BULGARIA LTD., Sofia (BG)

(*) Notice: Subject to any disclaimer, the term of this patent is extended or adjusted under 35 U.S.C. 154(b) by 1361 days.

(21) Appl. No.: 15/850,322

(22) Filed: Dec. 21, 2017

(65) Prior Publication Data
US 2018/0182951 A1  Jun. 28, 2018

(30) Foreign Application Priority Data
Dec. 22, 2016  (EP) .................... 16206528

(51) Int. Cl.
| | | |
|---|---|---|
| H01L 41/18 | (2006.01) | |
| H01L 41/12 | (2006.01) | |
| H01L 41/16 | (2006.01) | |
| H01L 41/00 | (2013.01) | |
| H01L 27/20 | (2006.01) | |
| H01L 41/311 | (2013.01) | |

(Continued)

(52) U.S. Cl.
CPC ............ *H01L 41/125* (2013.01); *H01L 27/20* (2013.01); *H01L 41/00* (2013.01); *H01L 41/0805* (2013.01); *H01L 41/16* (2013.01); *H01L 41/18* (2013.01); *H01L 41/20* (2013.01); *H01L 41/31* (2013.01); *H01L 41/311* (2013.01); *H01L 41/47* (2013.01); *H03K 17/97* (2013.01)

(58) Field of Classification Search
CPC ..... H01L 41/25; H01L 41/0805; H01L 41/20; H01L 41/18
See application file for complete search history.

(56) References Cited

U.S. PATENT DOCUMENTS

| | | | |
|---|---|---|---|
| 2014/0232433 A1* | 8/2014 | von Kluge | H01L 22/30 438/289 |
| 2014/0264632 A1* | 9/2014 | Richter | H01L 29/7845 438/197 |

(Continued)

FOREIGN PATENT DOCUMENTS

EP  0091739 A1  10/1983

OTHER PUBLICATIONS

Extended European Search Report from EP Application No. EP 16206528, dated Jun. 22, 2017.

*Primary Examiner* — Bryan P Gordon
(74) *Attorney, Agent, or Firm* — Workman Nydegger

(57) ABSTRACT

A semiconductor device comprising a passive magnetoelectric transducer structure adapted for generating a charge via mechanical stress caused by a magnetic field. The first transducer structure has a first terminal electrically connectable to the control terminal of an electrical switch, and having a second terminal electrically connectable to the first terminal of the electrical switch for providing a control signal for opening/closing the switch. The switch may be a FET. A passive magnetic switch using a magnetoelectric transducer structure. Use of a passive magnetoelectric transducer structure for opening or closing a switch without the need for an external power supply.

17 Claims, 20 Drawing Sheets

(51) Int. Cl.
*H01L 41/08* (2006.01)
*H01L 41/20* (2006.01)
*H01L 41/31* (2013.01)
*H01L 41/47* (2013.01)
*H03K 17/97* (2006.01)

(56) References Cited

U.S. PATENT DOCUMENTS

2014/0375174 A1\* 12/2014 Yan ................. C04B 35/493
 156/89.12
2018/0182951 A1\* 6/2018 Burssens ............... H01L 41/31

\* cited by examiner

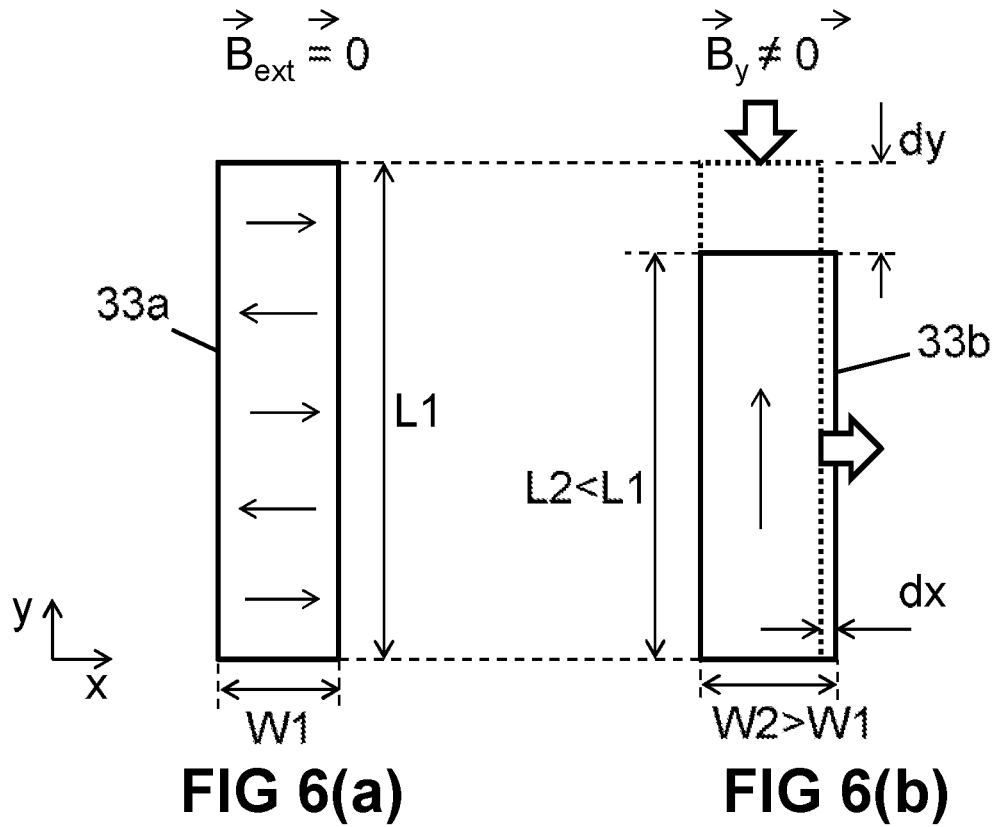
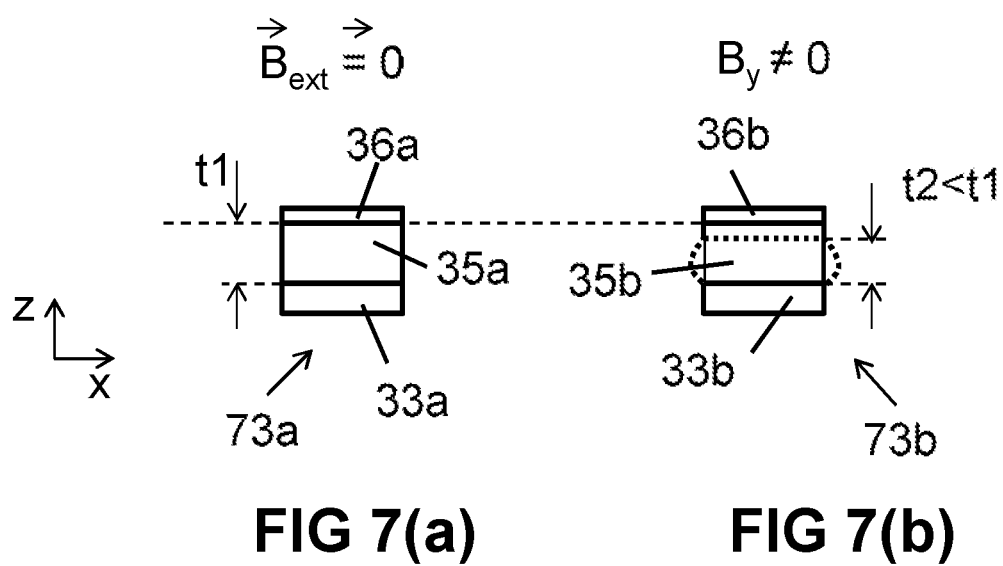

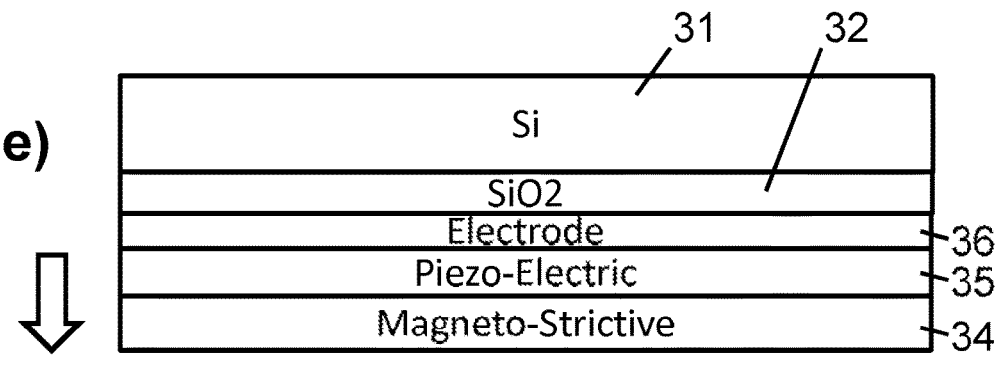
FIG 22(e)
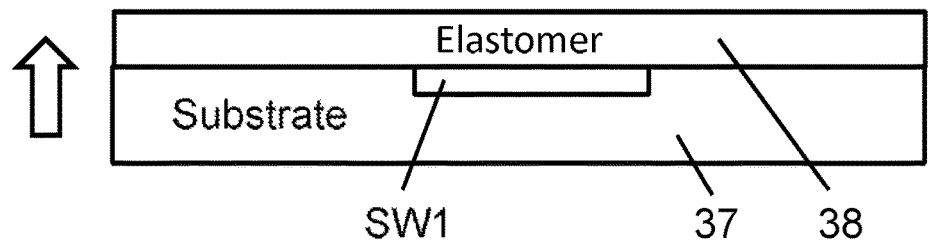
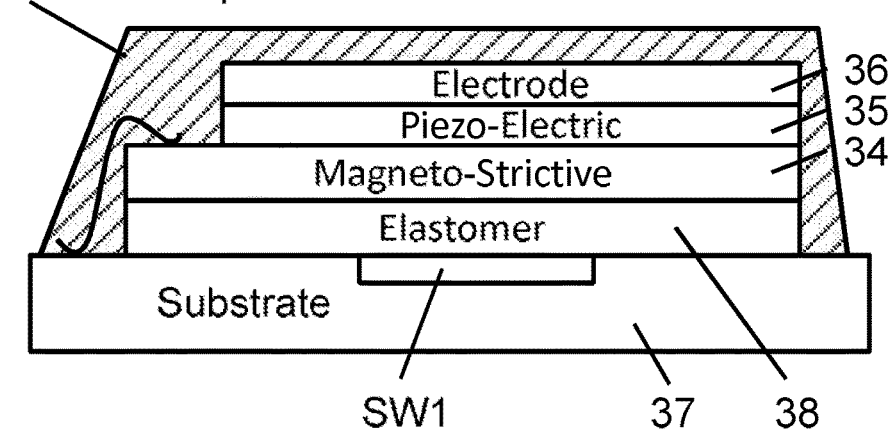
FIG 22(f)

SEMICONDUCTOR DEVICE COMPRISING PASSIVE MAGNETOELECTRIC TRANSDUCER STRUCTURE

FIELD OF THE INVENTION

The present invention relates to the field of semiconductor devices comprising a passive magnetoelectric transducer structure, and to the field of passive magnetic switches.

BACKGROUND OF THE INVENTION

Devices for detecting the presence of a magnetic field are known in the art. Well known examples are: a reed switch as an example of a discrete mechanical component, and a Hall element as an example of a component embedded in an integrated semiconductor device.

The reed switch, invented in 1936, is an electrical switch operated by an applied magnetic field. It consists of a pair of contacts of ferrous metal reeds in a hermetically sealed glass envelope. The contacts may be normally open but closing when a magnetic field is present, or normally closed and opening when a magnetic field is applied. The switch may be actuated by a coil, making a reed relay, or by bringing a magnet near to the switch. Once the magnet is pulled away from the switch, the reed switch will go back to its original position. Reed switches are used for example as a proximity switch for a burglar alarm. The technology for making reed switches is very mature, but as such they cannot be integrated in semiconductor devices. A major advantage of reed switches is that they are passive devices, meaning that they do not require electrical energy for sensing the presence of a magnetic field.

Hall elements are well known integrated devices for sensing a magnetic field. Hall elements typically have four nodes: two energising nodes and two sensing nodes. When a constant voltage or a constant current is applied over the energising nodes, the strength of the magnetic field can be measured as a differential voltage over the sensing nodes. A disadvantage of Hall elements is that they require electrical energy.

SUMMARY OF THE INVENTION

It is an object of embodiments of the present invention to provide a semiconductor device comprising a magnetoelectric transducer structure, and to a method of making such a device, and to the use of such a magnetoelectric transducer structure.

It is an object of particular embodiments of the present invention to provide a passive magnetic switch.

These and other objectives are accomplished by a semiconductor device and a method of producing such a semiconductor device according to embodiments of the present invention.

In a first aspect, the present invention provides a semiconductor device comprising: a passive magnetoelectric transducer structure adapted for generating a charge caused by mechanical stress induced by a magnetic field.

In an embodiment, the semiconductor device further comprises a semiconductor switch electrically connected to said passive magnetoelectric structure, the switch having a first terminal and a second terminal and a control terminal, the switch being adapted for selectively electrically connecting and disconnecting the first and second terminal depending on a signal presented at the control terminal; the transducer structure having a first terminal electrically connected to the control terminal of the switch, and having a second terminal electrically connected to the first terminal of the switch, and being adapted for opening or closing the switch.

It is noted that "electrically connected to the control terminal" can mean a direct connection, or an indirect connection, for example via a passive subcircuit such as for example a rectifier circuit or a differential bridge circuit, e.g. a Wheatstone-bridge, or the like.

The passive transducer structure may comprise or may be a piezoelectric material.

It is an advantage of this structure that it allows to make a passive switch, capable of opening or closing the switch without requiring energy from for example a battery.

The switch may be a component that provides an electrical path with a variable resistance, depending on the control signal. When the resistance value is lower than a predefined resistance value, e.g. lower than 1000 Ohm, the switch is considered to be "closed". When the resistance value is higher than said predefined number, the switch is considered to be "open".

In an embodiment, the semiconductor switch is a Field Effect Transistor having a gate being the control terminal, and a source being the first terminal, and a drain being the second terminal, or the semiconductor switch is a Field Effect Transistor having a gate being the control terminal, and a source being the second terminal, and a drain being the first terminal.

When the voltage of the gate is sufficiently higher than the voltage of the source, or sufficiently lower than the voltage of the drain, the transistor is switched "ON", i.e. a low resistive electrical path is formed between the source and the drain, or in other words, the switch is "closed".

The FET may be selected from the group consisting of JFET, MOSFET, MNOS, DGMOSFET, DEPFET, FREDFET, HIGFET, MODFET, TFET, IGBT, HEMT, ISFET, MESFET, NOMFET, GNRFET, VeSFET, CNTFET, OFET, QFET.

In an embodiment, the magnetoelectric transducer structure is mounted to a substrate or arranged inside a package in such a way that the magnetoelectric transducer structure has a first stiffness or first E-modulus in a first direction, and a second stiffness or a second E-modulus in a second direction perpendicular to the first direction, different from the first stiffness or first E-modulus.

In an embodiment, the ratio of the first and second E-modulus is smaller than 90% or larger than 110%, for example smaller than 80% or larger than 120%, for example less than 70% or larger than 130%.

In an embodiment, the first and second stiffness is defined by the size and/or geometry of the magnetoelectric layer having a non-constant thickness and/or a non-uniform shape, or because the magnetoelectric layer is fixedly connected or mounted to or comprises a non-flexible elongated element.

It is an advantage of such a structure that it has a different "stiffness" in different directions parallel to the substrate. In other words, in these embodiments, the magnetoelectric transducer structure is mounted in a particular way so as to cause an asymmetrical stiffness. This allows to induce a polarization in a direction (Z) perpendicular to the plane of the substrate causing a voltage difference between the top and bottom surface, and an opposite charge on both surfaces of the piezoelectric layer.

In an embodiment, the magnetoelectric transducer structure is connected to a substrate by means of an elastic connection over a major portion of its surface area, and by means of an elongated strip having a length over width ratio of at least 2.0 over a minor portion of of its surface area.

In an embodiment, the magnetoelectric transducer structure is flexibly mounted to a substrate over a central portion of the transducer structure and fixedly connected to the substrate on at least two distinct locations for reducing mechanical expansion or contraction of the transducer structure between these locations when a magnetic field is applied.

In an embodiment, the magnetoelectric transducer structure is flexibly mounted to a package over a central portion of the transducer structure and fixedly connected to the package on at least two distinct locations for reducing mechanical expansion or contraction of the transducer structure between these locations when a magnetic field is applied.

In an embodiment, the semiconductor device further comprises an elongated element having a stiffness or an E-modulus higher than that of the magnetoelectric transducer structure, which elongated element is mounted to the transducer structure (ME) on at least two distinct locations for reducing mechanical expansion or contraction of the transducer structure between these locations when a magnetic field is applied.

These are a few specific examples of ways how a magnetoelectric transducer structure with an asymmetric stiffness can be provided, as will be illustrated for example in FIG. 8 to FIG. 11.

In an embodiment, the passive magnetoelectric transducer structure comprises a magnetostrictive layer intimately mechanically coupled to a piezoelectric layer or piezoelectric element.

Optionally the piezoelectric layer or piezoelectric element comprises a piezoelectric material selected from the group consisting of AlN, ZnO, AlScN, PZT and AlGaN.

Optionally the piezoelectric layer comprises an elongated element having a stiffness or an E-modulus higher than that of the magnetoelectric transducer structure for reducing mechanical expansion or contraction of the piezoelectric layer in the longitudinal direction of the elongated element when a magnetic field is applied.

Optionally the magnetostrictive layer comprises a magnetostrictive material selected from the group consisting of FeGa, FeCo, FeTb, FeCoSiB and FeCoB.

In an embodiment the passive magnetoelectric transducer structure comprises a piezoelectric film with embedded magnetostrictive powder. The piezoelectric film with embedded magnetostrictive powder has a preferential magnetization along a first axis in the absence of an external magnetic field.

In case the magnetostrictive material is a layer, it is preferred that the piezoelectric material is oriented such that the axis corresponding to the highest piezoelectric constant is substantially perpendicular to that the plane of the magnetostrictive layer. The preferential magnetisation of the magnetostrictive layer is typically parallel to the plane of the magnetostrictive layer.

In an embodiment, the piezoelectric element comprises a piezoelectric material selected from the group consisting of AlN, ZnO and AlScN.

The piezoelectric element may have a rectangular shape with a length (L) and a width (W), where a ratio of the length and the width is a value in the range from 2 to 100.

In an embodiment, the magnetostrictive layer comprises a magnetostrictive material selected from the group consisting of FeGa and FeCo.

In an embodiment, the first magnetostrictive material has a preferential magnetization along a first axis (e.g. X) in the absence of an external magnetic field.

In an embodiment, the passive magnetoelectric transducer structure comprises a plurality of at least two piezoelectric elements electrically connected in series and oriented in parallel with each other.

The series connection provides a larger signal for controlling the switch, thus the resistance of the switch is typically lower, and the control is more reliable.

Preferably each of the piezoelectric elements has a Length over Width ratio in the range from 2 to 100, for example in the range from 2 to 10, for example a L/W of about 5.

In an embodiment, the semiconductor device further comprises a second passive magnetoelectrical transducer structure comprising a second magnetostrictive layer intimately mechanically coupled to at least one second piezoelectric element, the second magnetostrictive layer comprising a second magnetostrictive material; and the second magnetostrictive material has a preferential magnetization along a second axis (e.g. Y) different from the first axis (e.g. X) in the absence of an external magnetic field.

The second magnetostrictive material can be the same or a different material from the first magnetostrictive material, but is preferably the same material. However, the second magnetostrictive layer is preferably physically separated from the first magnetostrictive layer, because it has a preferential magnetization along a different axis.

In an embodiment, the semiconductor device comprises a first magnetoelectrical stack comprising a first magnetostrictive material having a positive magnetostriction, and comprises a second magnetoelectrical stack comprising a second magnetostrictive material having a negative magnetostriction, and the first and the second magnetoelectrical stack being connected in series and being oriented so as to have different directions of maximum sensitivity.

In this way (unwanted) thermal sensitivity of the semiconductor device can be reduced.

The first and second magnetoelectrical stack may each contain a plurality of elongated strips, and the strips of the first stack may be oriented perpendicular to the strips of the second stack.

In an embodiment, the second passive magnetostrictive transducer structure comprises a plurality of at least two piezoelectrical elements electrically connected in series, each of these piezoelectrical elements being intimately mechanically coupled to the second magnetostrictive layer and being oriented in parallel with respect to each other, for providing a second voltage signal; and the device further comprises a passive electrical circuit for generating a differential signal between the first control signal and the second control signal.

The series connection provides a larger signal for controlling the switch, thus the resistance of the switch is typically lower, and the control is more reliable.

It is an advantage of the structure that provides two separate signals related to magnetic field components in two different directions, because this allows to use a differential signal between the signal obtained from the first magnetoelectrical structure and the signal obtained from the second magnetoelectrical structure, which is less sensitive to temperature, which makes the circuit suitable for automotive applications.

The passive electrical circuit can for example comprise one or more rectifier circuits, or a differential bridge circuit, e.g. a Wheatstone-bridge circuit.

It is an advantage to use the differential charge or voltage created by two magnetoelectric stacks that are sensitive to different magnetic stimuli Bx, By, in order to avoid charge generation by temperature changes or other stray effects.

In an embodiment, the first switch is embedded in a semiconductor substrate; and the substrate further comprises an elastomer layer; and the first passive magnetoelectric transducer structure is mounted to the elastomer layer such that the magnetostrictive layer is facing the elastomer layer.

The magnetostrictive layer may be in physical contact with the elastomer layer.

The substrate may be a silicon substrate, and/or the elastomer layer may comprise or consist of PDMS or polyimide.

In an embodiment, the semiconductor device furthermore comprises a state machine adapted for actively resetting the voltage over the magnetoelectric structure after a predefined time after a trigger event.

In a second aspect, the present invention provides a method of producing a semiconductor device according to the first aspect, comprising the steps of: providing a silicon substrate comprising an oxide layer on top of said silicon substrate; providing a first electrode layer on top of said oxide layer; providing a piezoelectric and magnetostrictive layer or structure; optionally annealing the first substrate in the presence of a constant magnetic field; providing a second substrate comprising at least one semiconductor switch having a first terminal and a second terminal and a control terminal; providing an elastomer layer on top of the second substrate; mounting the first substrate to the second substrate such that the piezoelectric and magnetostrictive layer or structure is facing the elastomer layer; removing the silicon and the silicon oxide layer of the first substrate; electrically connecting the first electrode to the first terminal of the switch, and electrically connecting the second electrode to the control terminal of the switch.

In an embodiment, the step of providing the piezoelectric and magnetostrictive layer or structure comprises the steps of: i) providing a piezoelectric layer on top of said first electrode layer; ii) optionally providing a second electrode layer on top of the piezoelectric layer; iii) providing a magnetostrictive layer on top of the second electrode or directly on top of the piezoelectric layer.

In an embodiment, the step of providing the piezoelectric and magnetostrictive layer or structure comprises the step of: iv) providing a piezoelectric layer comprising magnetostrictive powder, on top of said first electrode layer.

The method may further comprise a step of providing an elongated strip on top of the magnetostrictive layer, such that the elongated strip is directly connected to the magnetostrictive layer on at least two distinct locations.

The method may further comprise a step of providing two spaced openings (holes) or an elongated slot in the elastomer layer for connecting the magnetostrictive layer via said openings or via said slot to the substrate.

In a third aspect, the present invention relates to the use of a passive magnetoelectric transducer structure as specified in the first aspect, for creating an input signal for opening or closing an electrical switch, in particular an integrated semiconductor switch, without the need for an external power supply.

The present invention also relates to the use of a device according to the first aspect as a passive wake-up circuit for passing or blocking power to a second circuit.

The switch would typically be arranged in series with a supply voltage, and the wake-up circuit would connect the supply voltage to the second circuit (e.g. a metering device) when a magnetic field is applied to or approaches the device.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 6 shows an example of a magnetostrictive element in top view.

FIG. 6(a) shows that the magnetostrictive material has a preferential magnetization along the X axis, even in the absence of an external magnetic field.

FIG. 6(b) shows a magnetostrictive material with negative magnetostriction in the presence of a magnetic field having a component By along the Y axis, causing a contraction of the magnetostrictive material along the Y axis, and an expansion of the material along the X axis and the Z-axis.

FIG. 7 shows the magnetostrictive elements of FIG. 6 in side view, with a piezoelectric element and an electrode on top.

FIG. 7(a) shows the stack in the absence of a magnetic field.

FIG. 7(b) shows the stack of FIG. 6(b) in the presence of a magnetic field having a component along the Y axis, causing a contraction of the magnetostrictive material along the Y axis, further causing a contraction of the piezoelectric element mounted thereon and intimately connected thereto (not explicitly shown in FIG. 7 but see for example FIG. 3 to FIG. 5)

FIG. 8 to FIG. 8(b) shows a variant of the structure of FIG. 6(a), wherein the magnetostrictive strip is fixed at two ends or two sides thereof to the substrate, to mechanically prevent or at least reduce the magnetostrictive strip from shrinking in its longitudinal direction. (some layers are not shown).

FIG. 9 to FIG. 9(b) are a variant of the structure of FIG. 8, wherein the magnetostrictive strip is fixed at two ends or two sides thereof to a mould. (some layers are not shown).

FIG. 10 to FIG. 10(b) are a variant of the structure of FIG. 9, where the position of the magnetostrictive layer and the piezo-electric layer are swapped, and wherein the piezo-electric layer is fixed to the mold.

FIG. 11 to FIG. 11(b) are another variant of the structure of FIG. 8, where a stiff elongated element (different from the substrate and different from the package) is connected to the magnetostrictive strip, such that the structure has a higher mechanical stiffness in the longitudinal direction of the elongated element, and a smaller mechanical stiffness in a transverse direction.

FIG. 22(a) to (f) also illustrates the method according to the present invention.

Figure 1:
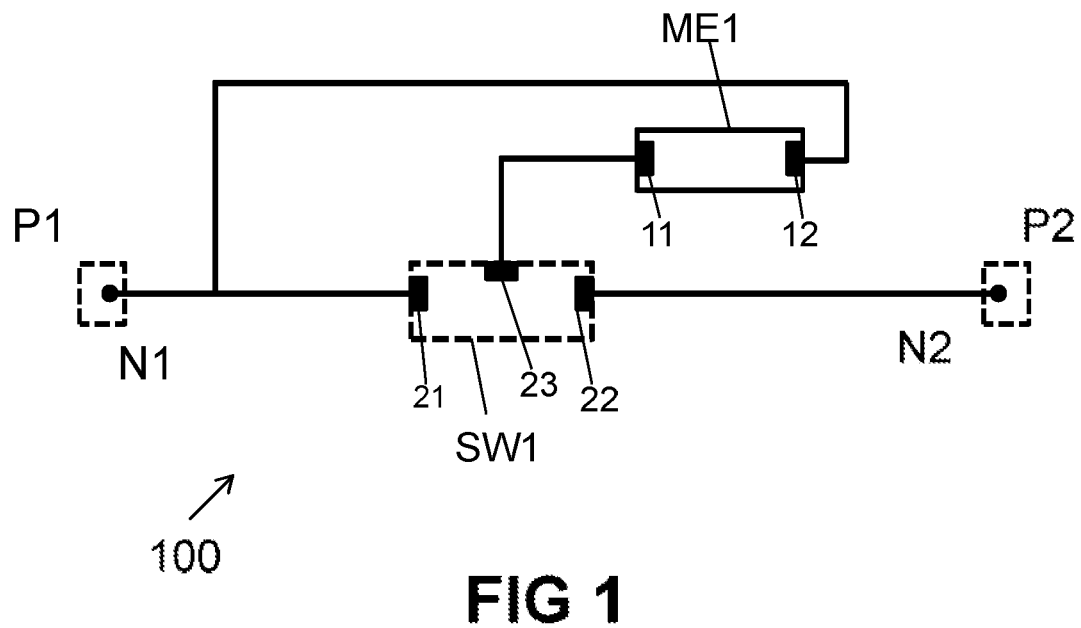
FIG. 1 shows an embodiment of a semiconductor device according to the present invention. The device comprises a magnetoelectric transducer structure or element and optionally a switch.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

When reference is made to "magnetised along the X axis", what is meant is that, the material has a preferential magnetization as shown in FIG. 6(a), where, in the absence of an external magnetic field Bext, the local magnetisation vector is substantially parallel to the X axis, but can point in the positive or negative direction of the X axis. In other words there is 180° ambiguity. From large scale point of view, the net magnetisation is zero, where the local magnetisation is compensated by an inversed magnetisation in other positions. In other words, the anisotropy primarily caused by annealing under a constant magnetic field causes the local magnetisation to prefer a direction parallel to the X-axis.

In this document the terms "magnetoelectric transducer" and "magnetoelectric transducer structure" and "magnetoelectric stack" are used as synonyms. It can for example comprise a single magnetoelectric element, or a plurality of magnetoelectric elements electrically connected in series. It can for example be made of a real magnetoelectrical element, or it can be formed by a composite layer consisting of magnetostrictive grains embedded in a piezoelectrical layer, or it can consist of a single magnetostrictive layer in direct mechanical contact with a single piezoelectric layer, or it can consist of alternate layers of magnetostrictive and piezoelectrical material.

The term "E-modulus" or "Young-modulus" mean the same. The larger the E-modulus of a material, the stiffer a material is. The smaller the E-modulus, the more flexible a material is. But stiffness can also be increased by changing the shape and/or the geometry of a structure.

The present invention will be explained primarily for a structure having a discrete magnetostrictive layer (or film) and a discrete piezoelectric layer (or film), for ease of description, but the present invention is not limited thereto, and for example a piezoelectric layer with magnetostrictive powder embedded therein, can also be used.

FIG. 1 shows a semiconductor device 100 comprising a magnetoelectric transducer structure ME1 operatively connected to an electrical switch SW1.

The electrical switch SW1 has a first terminal 21 and a second terminal 22 which are to be substantially electrically connected or substantially electrically disconnected from each other. The electrical switch SW1 further comprises a third terminal, also referred to as control terminal 23 for controlling the state of the switch. The switch SW1 has two main states or main modes of operation: open or closed.

The magnetoelectric transducer ME1 is adapted for providing a voltage signal to said third terminal 23 of the switch SW1 when the external magnetic field (and hence also the magnetic field in close vicinity of ME1) changes, e.g. when the amplitude of the magnetic field increases, for example when a permanent magnet has approached the device. Any known magnetoelectric transducer known in the art can be used in devices of the present invention, but a few preferred embodiments of such a structure will be described further, in particular when discussing FIG. 3 to FIG. 14 and FIG. 21 to FIG. 23.

The first terminal 21 of the switch SW1 is connected to a first node N1 of a semiconductor device, which can be an internal node or can be connected to an external pin P1 of the semiconductor device. Likewise, the second terminal 22 of the switch SW1 is connected to a second node N2 of the semiconductor device, which can be an internal node or can be connected to an external pin P2. The device 100 can be used to replace reed switches.

In preferred embodiments of the present invention, the electrical switch SW1 is a Field Effect Transistor, known as FET, providing an electrically resistive path between the first terminal 21 and the second terminal 22. The electrical resistance of said path depends on the voltage applied to the control terminal 23. Ideally the resistance is either zero or infinitely high, but in practice of course the resistance is "relatively low", e.g. lower than a predefined resistance value (for example lower than 1000 ohm or lower than 500 ohm or lower than 250 ohm) when the switch SW1 is in a state called "closed", and the resistance value is "relatively large", e.g. larger than the predefined resistance value (for example larger than 1000 ohm or larger than 2000 ohm or larger than 4000 ohm) when the switch SW1 is in a state called "open".

As an example, the predefined resistance value can for example be 1000 Ohm, thus allowing a current of 1 mA when a voltage difference of 1 V is present over the two nodes N1, N2. Basically in silicon there is about a factor of 8 magnitudes between the current flowing in the "open" and the "closed" state, for example about 1 mA in open state and about 10 pA in closed state. In battery powered applications, a latent current of 10 μA or 10 pA makes a huge difference in terms of battery life).

Although semiconductor devices according to the present invention do not necessarily have a switch SW1, in particular a FET, the invention will be further explained for the switch SW1 being a FET, in which case the first and second terminal 21, 22 are called "source" and "drain", and the control terminal 23 is called "gate". Any known or yet unknown type of FET can be used in embodiments of the present invention, for example: any FET selected from the group consisting of JFET, MOSFET, MNOS, DGMOSFET, DEPFET, FREDFET, HIGFET, MODFET, TFET, IGBT, HEMT, ISFET, MESFET, NOMFET, GNRFET, VeSFET, CNTFET, OFET, QFET.

An important aspect of the present invention is the use of a magnetoelectric structure for controlling a FET, which is not a trivial combination, inter alia because it cannot be readily predicted that the voltage generated by such a structure is sufficiently high for reliably controlling the FET. However, the inventors have found that by using a stack having suitable dimensions and made of suitable materials, a sufficient amount of charge (and thus voltage) can be generated to reliably control the FET, even with magnetic field strengths in the order of a few milliTesla. More specifically, by using sufficiently thick layers (e.g. at least 1.0 or at least 2.0 μm or at least 4.0 μm thick), and sufficiently large structures (e.g. at least 0.1 mm²), and by using materials having high magnetostrictive (e.g. at least 100 ppm or at least 200 ppm) or high piezoelectric properties (e.g. at least 0.5 C/m² or at least 1 C/m²).

Figure 2:
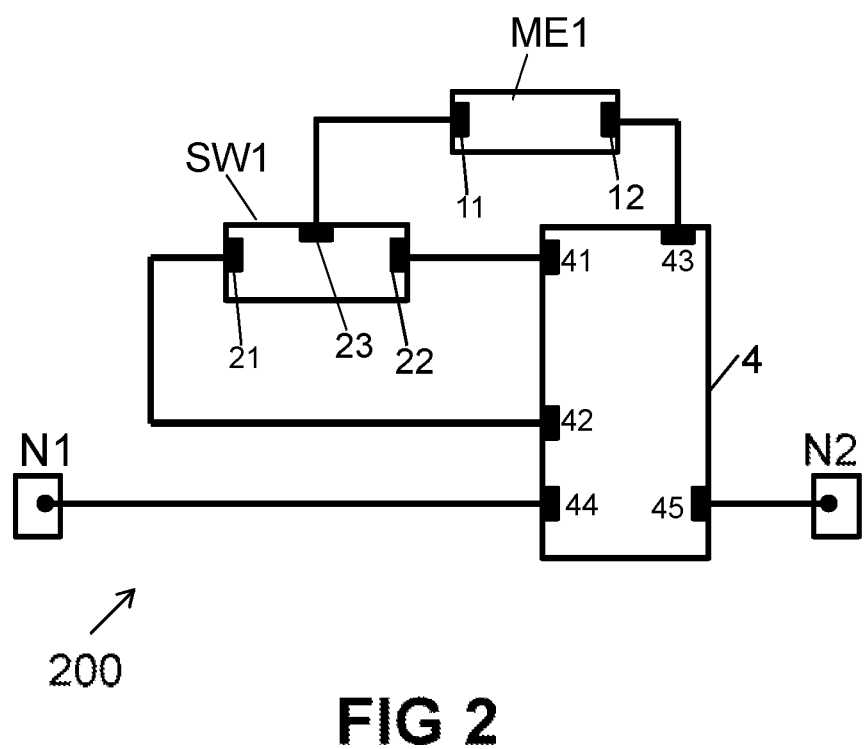
FIG. 2 shows another embodiment of a semiconductor device according to the present invention. The device comprises a magnetoelectric element and optionally a switch, and optionally additional circuitry.

FIG. 2 shows a semiconductor device 200 as another particular embodiment of the present invention. The device 200 comprises a magnetoelectric element ME1 and a switch SW1, and an additional circuitry 4. The additional circuitry 4 may contain only passive components such as for example one or more components selected from the group consisting of: resistors, capacitors, diodes, or may furthermore contain active components, such as transistors.

In the example shown in FIG. 2, the additional circuit 4 is arranged between the first and second node N1, N2, (which as mentioned above can be internal nodes or can be connected to external pins), but in other embodiments of the present invention, the additional circuit may be arranged between the passive magnetoelectric transducer ME1 and the control terminal 23 of the switch SW1. As can be seen, no voltage supply other than the voltage created by the magnetoelectric element ME1 is used to energize the additional circuitry 4.

Figure 3:
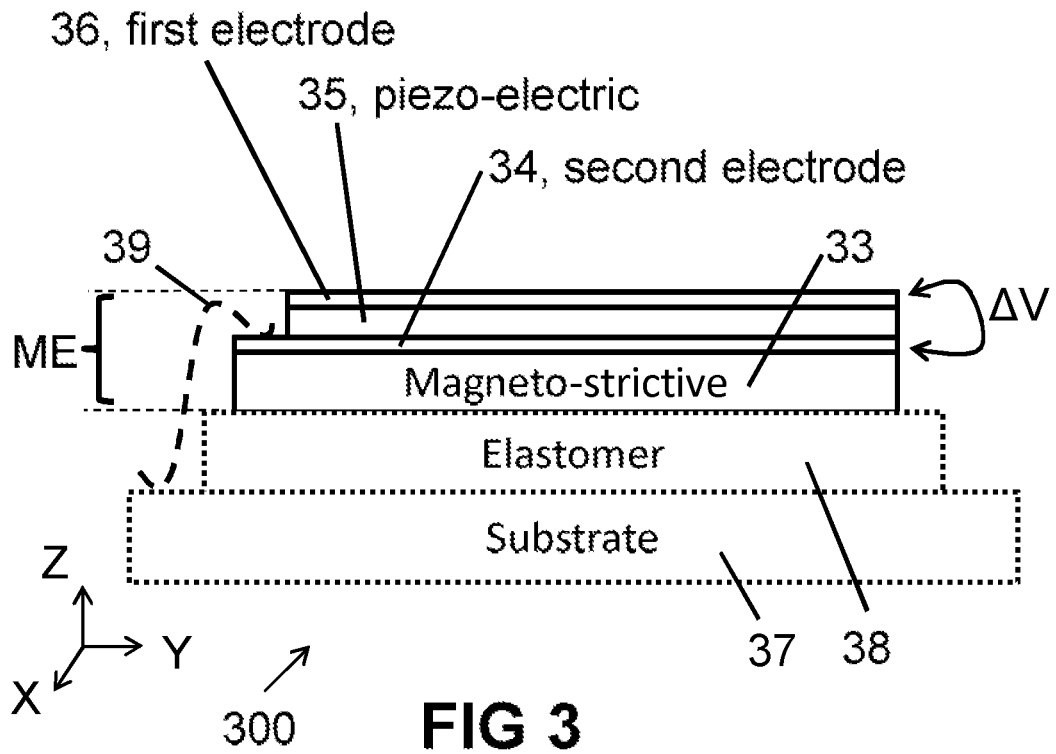
FIG. 3 shows an example of a material stack as can be used in embodiments of the present invention, comprising a magnetostrictive element (or layer) and a piezoelectrical element (or layer) and two additional electrodes. In this embodiment, both electrodes are located on the same (upper) side of the magnetostrictive layer.

FIG. 3 shows a material stack 300 as can be used in embodiments of the present invention. The stack forms a passive MagnetoElectric transducer structure "ME" mounted on a carrier. The carrier may furthermore comprise the switch SW1 (not shown in FIG. 3), although that is not absolutely required, and the switch SW1 may also be located on another substrate.

The stack comprises:
a magnetostrictive layer 33. This layer can consist of or comprise for example FeGa or FeCo;
an electrode layer 34, referred to herein as "second electrode", on top of the magnetostrictive layer 33, for example consisting of or comprising FeCo or Mo or Pt;
a piezoelectric layer 35 on top of the electrode layer 34, for example consisting of or comprising AlN or ZnO or AlScN;
an electrode layer 36, referred to herein as "first electrode", on top of the piezoelectric layer 35, for example consisting of or comprising Pt or Mo or alloys thereof;
This stack should be flexibly mounted to a substrate 37, for example by means of an elastomer, such as PDMS or polyimide.

When a magnetic field is applied in the vicinity of the stack, for example by approaching the stack 300 with a permanent magnet, the magnetostrictive element 33 compresses in a particular direction (as will be explained in FIG. 6 and FIG. 7), thereby exerting mechanical stress on the piezoelectric layer 35. This causes the piezoelectric layer 35 to mechanically deform, which creates a voltage ΔV over the electrodes 34, 36 between which the piezoelectric layer 35 is sandwiched. As will be explained further, this voltage ΔV an be applied directly or indirectly to the gate 23 of a FET to function as a switch SW1.

The working principle of a "passive magnetic switch" according to the present invention is as follows: when the magnetic field is applied, the voltage ΔV is created by the piezoelectric structure 300, and the switch SW1 "closes", meaning the FET is "ON". When the magnetic field is removed, the voltage also removes, and the switch "opens", meaning the FET is "OFF".

In case there is a pull-down resistor (see e.g. FIG. 16), the gate of the switch is pulled towards a closed state when the magnetic field is removed. If there is no pull-down resistor (see e.g. FIG. 15 and FIG. 17), the gate "G" of the switch SW1 is not leaking and the voltage is removed when the charge is removed.

In preferred embodiments, AlScN is used as the piezoelectric layer, and Pt or Co is used as the material of the first electrode 36. This offers the advantage that the crystal lattice of the template matches the crystallographic (002) direction of the AlScN, hence the AlScN crystal preferentially grows in the right crystal orientation to produce the optimal piezoelectrical output. During production, the AlScN layer can be grown on top of the Pt or Mo layer.

Preferably 50Fe50Co is used as the magnetostrictive material. This alloy 50Fe50Co has good properties to support the application, e.g. high initial permeability (mu>1000) and low coercivity (<500 A/m or <600 μT) which reduces or minimizes the lag of electrical potential on the output versus the applied magnetic field, assuring that also small magnetic field changes (of about 1 mT) can be detected. This alloy has a high spontaneous magnetisation (in the order of about 2.1 T) allowing a broad working region until saturation (depending on the shape) and it has an acceptable magnetostriction (in the order of about 200 ppm) to generate enough strain/stress on the piezoelectrical layer.

Referring back to FIG. 3, the magnetostrictive layer 33 is intimately mechanically coupled to a piezoelectric layer 35 to allow mechanical deformation (as will be shown in more detail in FIG. 7). Preferably the first and the second electrode layer 36, 34 are relatively thin in comparison with the thickness of the piezoelectric layer 35. Preferably each layer has a thickness in the range from 0.2 to 6.0 μm, for example in the range from 1.0 to 5.0 μm, for example equal to about 2 μm.

The ME stack forming the magnetoelectric transducer, the stack comprising the magnetostrictive material and the piezoelectrical material and the electrodes 36, 34, is flexibly mounted to a substrate or carrier 37 via an elastic material, preferably a highly elastic material, e.g. a material having an E-modulus of about 0.0 to about 5.0 GPa, or an E-modulus in the range from 0.1 to 5.0 GPa, or an E-modules in the range from 0.5 to 5.0 GPa), for example an elastomer 38 such as for example polyimide or PDMS. This allows the ME-stack (and in particular the magnetostrictive material and the piezoelectrical material) to deform in the presence of a magnetic field without the need to mount the ME stack on a cantilever which is suspended at one end thereof, for example. This simplifies manufacturing by reducing the number of process steps since no steps are required to form a cantilever and a cavity to allow the deformation. The ME stack according to the present invention is also more robust against mechanical shocks, since such cantilevers can break.

Preferably the carrier is a semiconductor substrate 37 further comprising the semiconductor switch SW1 embedded therein. For example, the substrate 37 may be a CMOS substrate with the FET embedded therein, and further comprising conductive tracks for allowing interconnection with the electrodes 34, 36, for example via bondpads (not shown), in classical manners.

Figure 12:
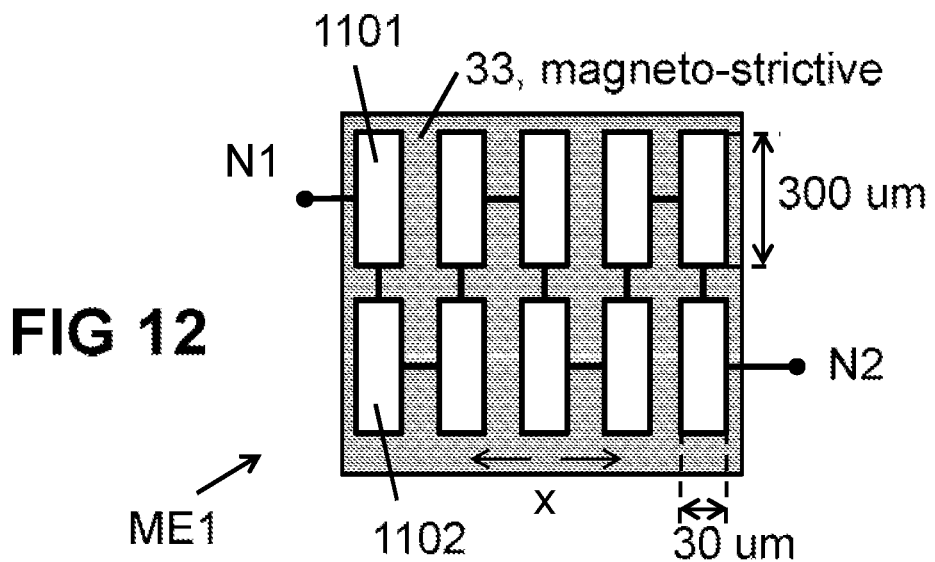
FIG. 12 shows an example of a first passive magnetoelectric transducer structure comprising a magnetostrictive layer and a plurality of piezoelectric elements in the form of elongated strips, e.g. rectangular strips, mounted thereon, as can be used in embodiments of the present invention.

The magnetostrictive layer 33 is typically one single layer of the stack. This single layer 33 may comprise one single zone or region (as shown in FIG. 12), or may comprise at least two separate zones or regions, as will be explained further when discussing FIG. 13 and FIG. 14. The ME stack may be completely covered by another PDMS layer (not shown in FIG. 3), assuring decoupling from the package stress. Alternatively the ME stack may be partly covered by an elastomer layer 92 at a major portion of its surface, but be in direct contact with the chip package (e.g. with a mould compound 93) at specific positions, as will be explained further in FIG. 9 or FIG. 10. As explained later in FIG. 16, using separate structures may allow to reduce or reject package stress and/or thermal stress.

Figure 4:
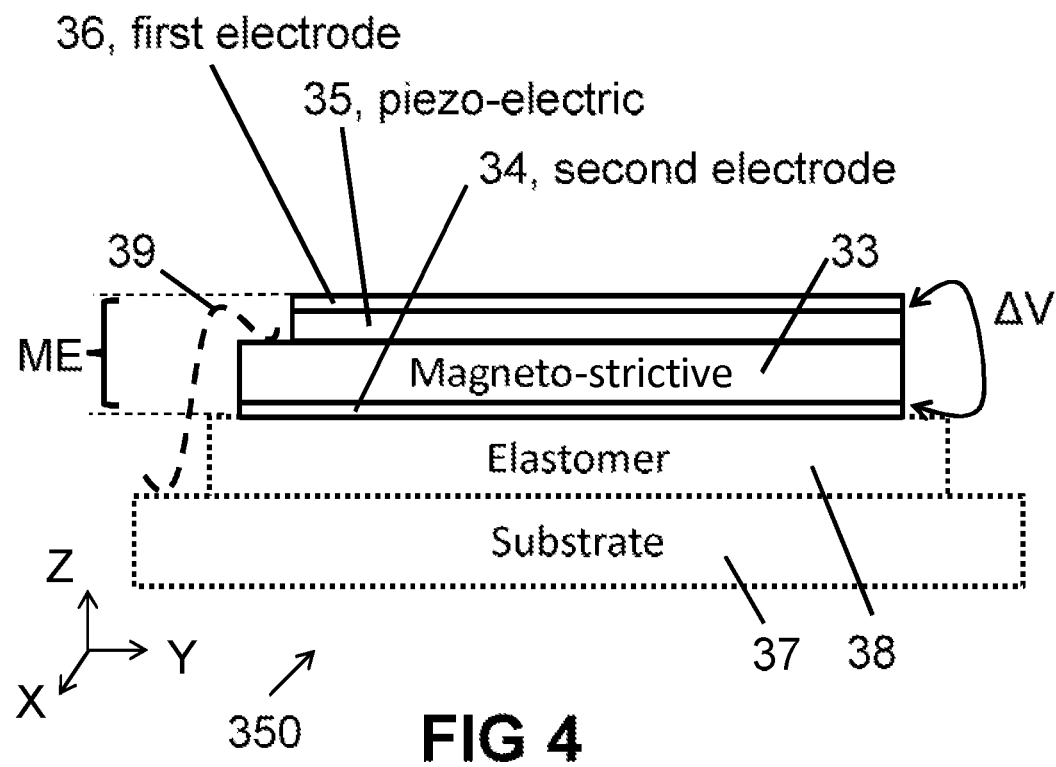
FIG. 4 shows a variant of the semiconductor stack of FIG. 3 as can be used in embodiments of the present invention. In this embodiment, the electrodes are located on opposite sides of the magnetostrictive layer, or in other words, the magnetostrictive layer is located between the two electrodes.

FIG. 4 shows a material stack 350 similar to that of FIG. 3, except that the electrodes 34, 36 are located on opposite sides of the magnetostrictive layer 33. Or stated in other words, the magnetostrictive layer 33 is located between the two electrode layers 34, 36, but the working principles of the magnetoelectric stack are the same: when a magnetic field is applied, a voltage is generated over the electrodes by the interaction between the magnetostrictive and piezoelectric layer, and when the magnetic field is removed or disappears, the voltage also disappears. This voltage is used to open or close a switch SW1, resulting in a "passive magnetic switch".

Figure 5:
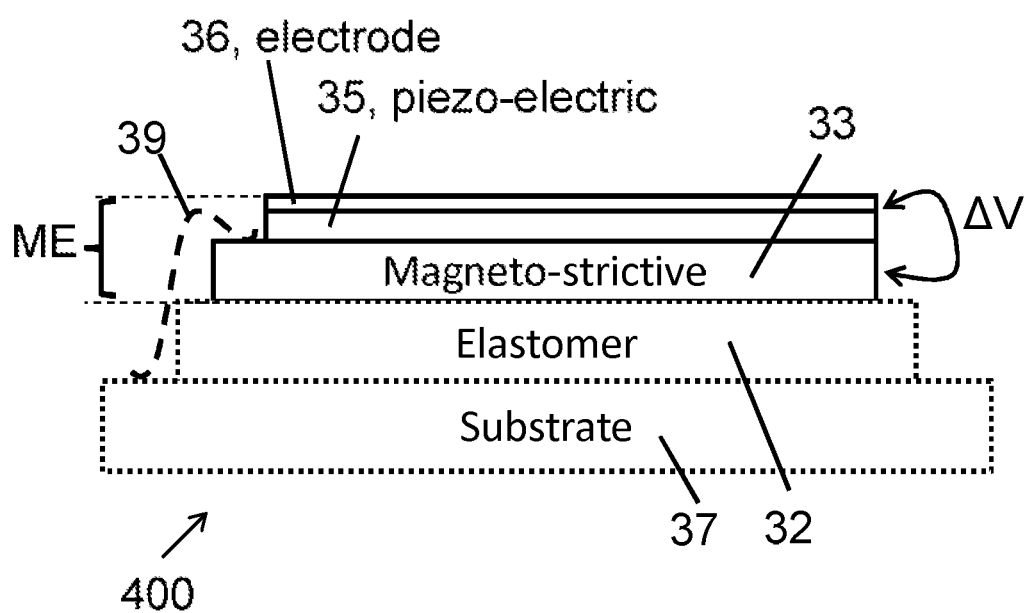
FIG. 5 shows another semiconductor stack as can be used in embodiments of the present invention, comprising a magnetostrictive element (or layer) and a piezoelectrical element (or layer) and only one additional (first) electrode, the magnetostrictive element forming the other (second) electrode.

FIG. 5 shows a material stack 400 similar to that of FIG. 3, except that the second electrode layer 34 between the magnetostrictive layer 33 and the piezoelectric layer 35 is omitted, and that the magnetostrictive layer 34 itself is electrically conductive, and functions as second electrode. Everything else described above for the stack 300 is also applicable here. The stack 400 is easier to produce than the stack 300 of FIG. 3 and the stack 350 of FIG. 4. Suitable materials for the magnetostrictive layer are for example: NiFe, FeTb, FeGa, terfenol, FeCo.

FIG. 6 shows an example of a magnetostrictive layer 33 having a rectangular shape, when seen in top view. This rectangle is also referred to herein as "magnetostrictive element" 33.

FIG. 6(a) shows that the magnetostrictive element has a preferential magnetization along the X axis, even in the absence of an external magnetic field Bext. This behaviour is not obtained automatically, but can be created by annealing the magnetostrictive material in the presence of a constant magnetic field oriented parallel with the X-axis (see step 1906 and/or step 1923 in FIG. 21) during the production stage.

Preferably the ratio of the length L1 and the width W1 is a value in the range from 2 to 200, for example a value in the range from 2 to 20, for example equal to about 5 or equal to about 10.

FIG. 6(b) shows the magnetostrictive element 33 of FIG. 6(a) in the presence of an external magnetic field Bext oriented in the Y-direction, or at least having a non-zero component along the Y axis, as can be achieved for example by approaching the ME stack with a permanent magnet. Assuming the magnetostriction is negative, then such approach causes a contraction of the magnetostrictive element 33 along the Y axis, and an expansion of the material along the X axis and a contraction in the Z-axis The main effect in X and Y direction are caused by the magnetostriction effects.

FIG. 7 shows the magnetostrictive element 33 of FIG. 6 in side view, with a piezoelectric element 35 and an electrode 36 of the same length and width on top, forming the magnetoelectric element 73a. It is assumed in this example that the magnetostrictive material is conductive, and that the layer 33a is electrically conductive, hence functions also as the second electrode layer. Otherwise, a second electrode layer can also be added (not shown), as explained in FIG. 5.

FIG. 7(a) shows the magnetostrictive stack 73a in the absence of a magnetic field Bext.

FIG. 7(b) shows the stack of FIG. 7(a) in the presence of a magnetic field having a component along the Y axis, causing a contraction of the magnetostrictive material 33b along the Y axis, further causing a contraction in the Y-direction of the piezoelectric element 35b mounted thereon and intimately connected thereto. This mechanical deformation causes a voltage to be generated between the electrodes.

In the example of FIG. 6 and FIG. 7 a magnetostrictive material with a negative magnetostriction was used, a magnetic field with a component in the Y-direction would cause a contraction in the Y-direction, and an expansion in the X-direction. In contrast, if a magnetostrictive material with a positive magnetostriction was used, a magnetic field with a component in the Y-direction would cause an expansion in the Y-direction and a contraction in the X-direction, but in both cases, a voltage would be generated by the piezoelectric layer.

FIG. 8 shows a variant of the structure of FIG. 6(a), wherein the magnetostrictive element 33 has a U-shape or a bridge shape, and wherein opposite sides of the magnetostrictive layer are directly connected to the substrate 37 to prevent or at least reduce mechanical contraction in the Y-direction. In FIG. 6 and FIG. 7 it was explained that the magnetostrictive layer tends to contract in the presence of a magnetic field, but due to the fixation, it is prevented from contracting (as indicated by "L2=L1"). It was found that such fixation causes an even larger charge and an thus an even larger voltage to the gate of the FET, which is beneficial for lowering the resistance of the switch SW1. In other words, the fixation enhances the effect of charge generation.

Figures 8A, 8B:
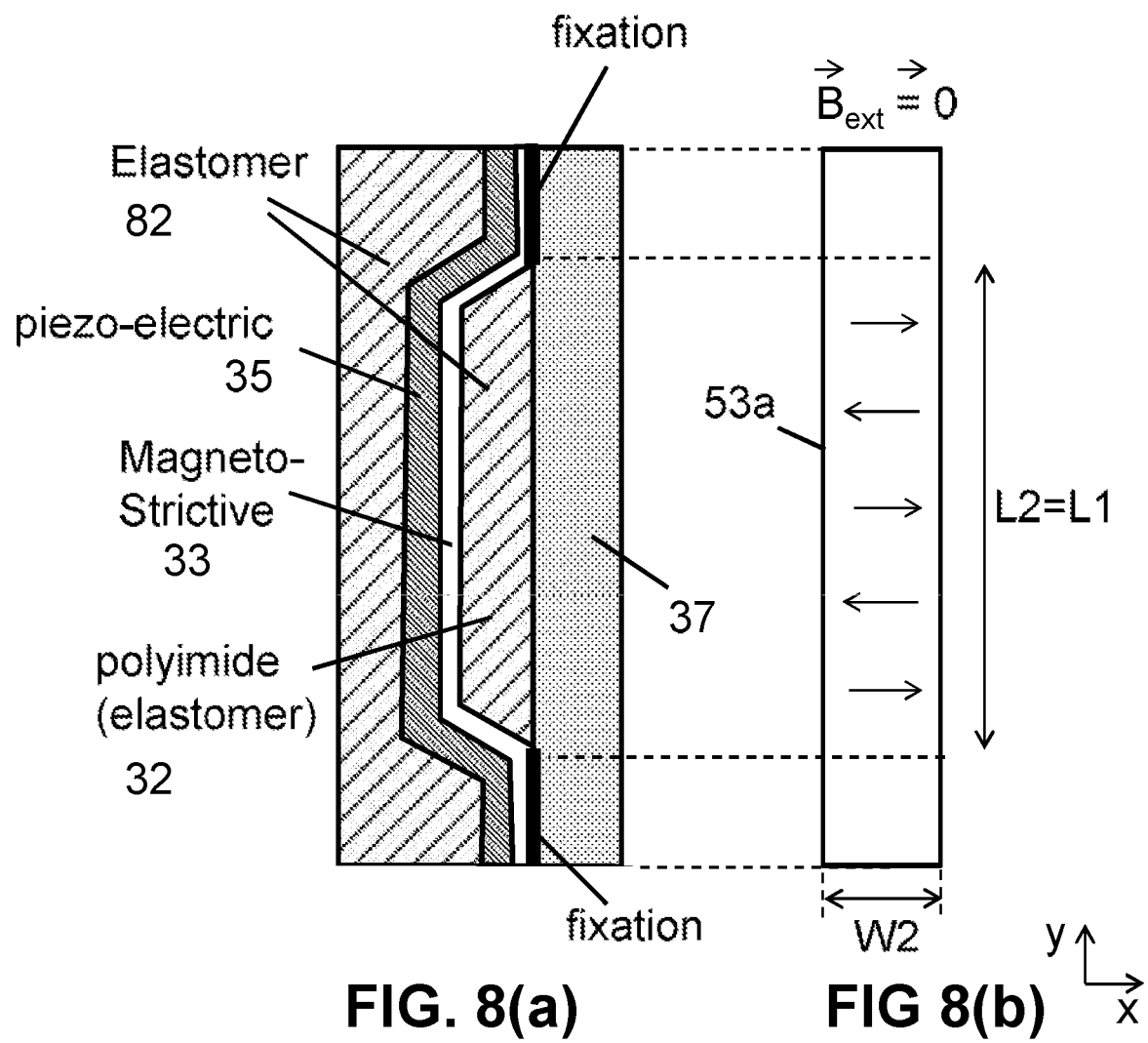

In other words, the magnetostrictive strip 33 of FIG. 8 is an elongated strip, which is fixed at opposite ends to the substrate 37 in a non-elastic manner. The location where the magnetostrictive strip 33 is in direct contact with the substrate is indicated by a thick black line in FIG. 8(a) for illustrative purposes. This asymmetric connection has the effect that, as the material movement is restricted in the Y direction, there is a tensile stress arising in Y-direction (when a magnetic field is applied) which causes the thickness (and the width) of the magnetostrictive layer 33 to decrease and a polarisation to arise on the piezoelectrical layer. It is noted that the electrode layer(s) is/are not explicitly shown in FIG. 8 for illustrative purposes, in order not to overload the drawing, but to highlight where the magnetostrictive layer 33 is fixedly or resiliently mounted. The skilled reader will understand that the piezoelectric layer is in intimate contact with the magnetostrictive layer 33 in a similar manner as shown in FIG. 3 and FIG. 4. Since the piezo-electric layer is grown, the axis of the crystal is preferably pointing as much as possible toward the polarization axis, perpendicular to the electrode(s).

Figures 9A, 9B:
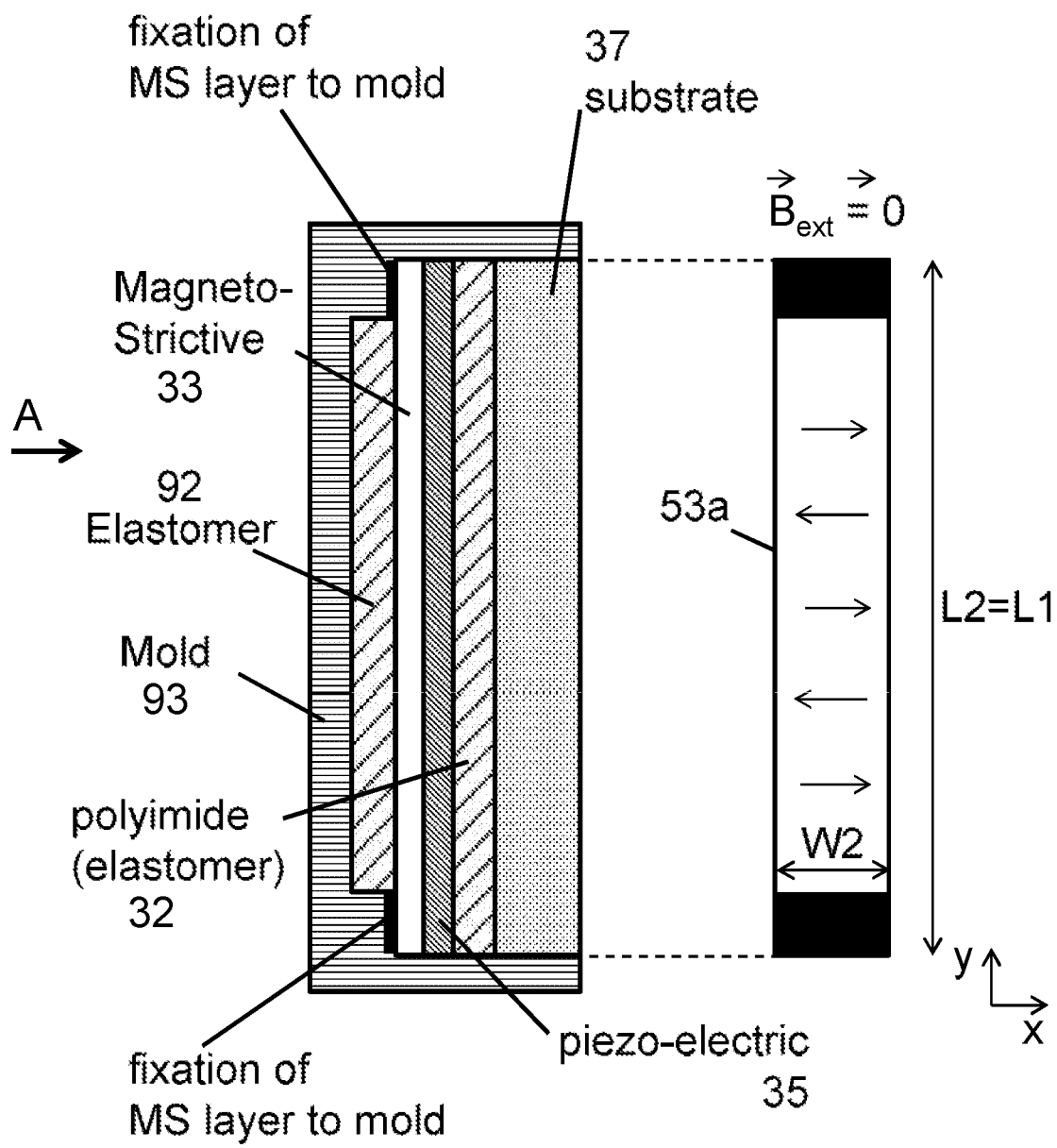

FIG. 9(a) shows a variant of the structure of FIG. 8, wherein the magnetostrictive strip 33 is also fixed at two ends thereof, but not to the substrate, but to the package 93, e.g. made of plastic molding compound. Of course, it would also be possible to connect the magnetostrictive strip 33 both to the substrate and to the package. The same effect as described above (in FIG. 8) also occurs here.

Also in FIG. 9, not all layers of the stack are shown, for example the electrode layer(s).

FIG. 9(b) shows a view on the structure of FIG. 9(a) as seen in the direction indicated by arrow "A", if the molding compound 93 would not be present. The contact area between the magnetostrictive material and the molding compound is indicated by two black lines in FIG. 9(a) and two black surfaces in FIG. 9(b), for illustrative purposes only.

Figures 10A, 10B:
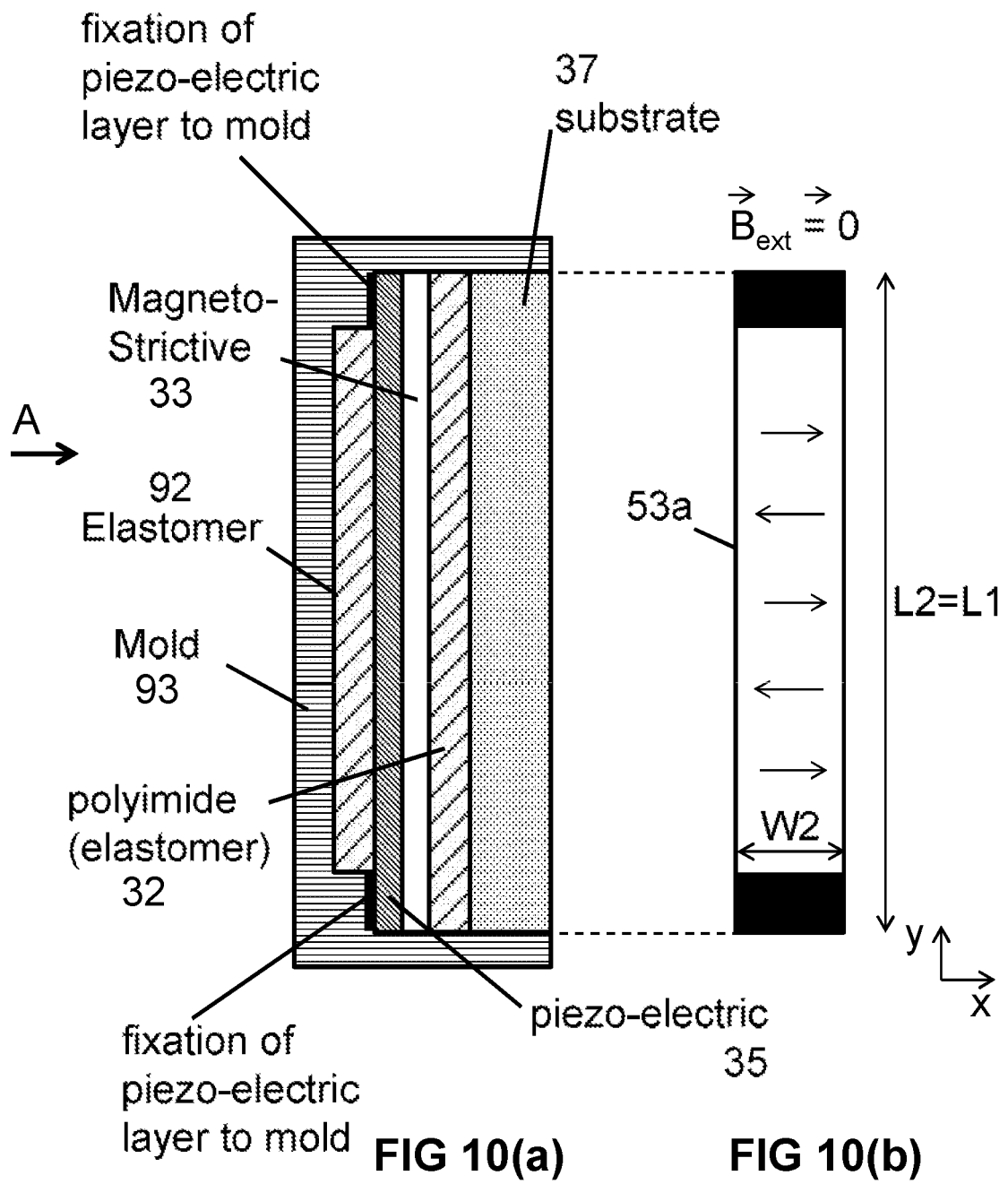

FIG. 10 is a variant of the structure of FIG. 9, where the position of the magnetostrictive layer and the piezo-electric layer are swapped, and wherein the piezo-electric layer is fixed to the mold.

Figures 11A, 11B:
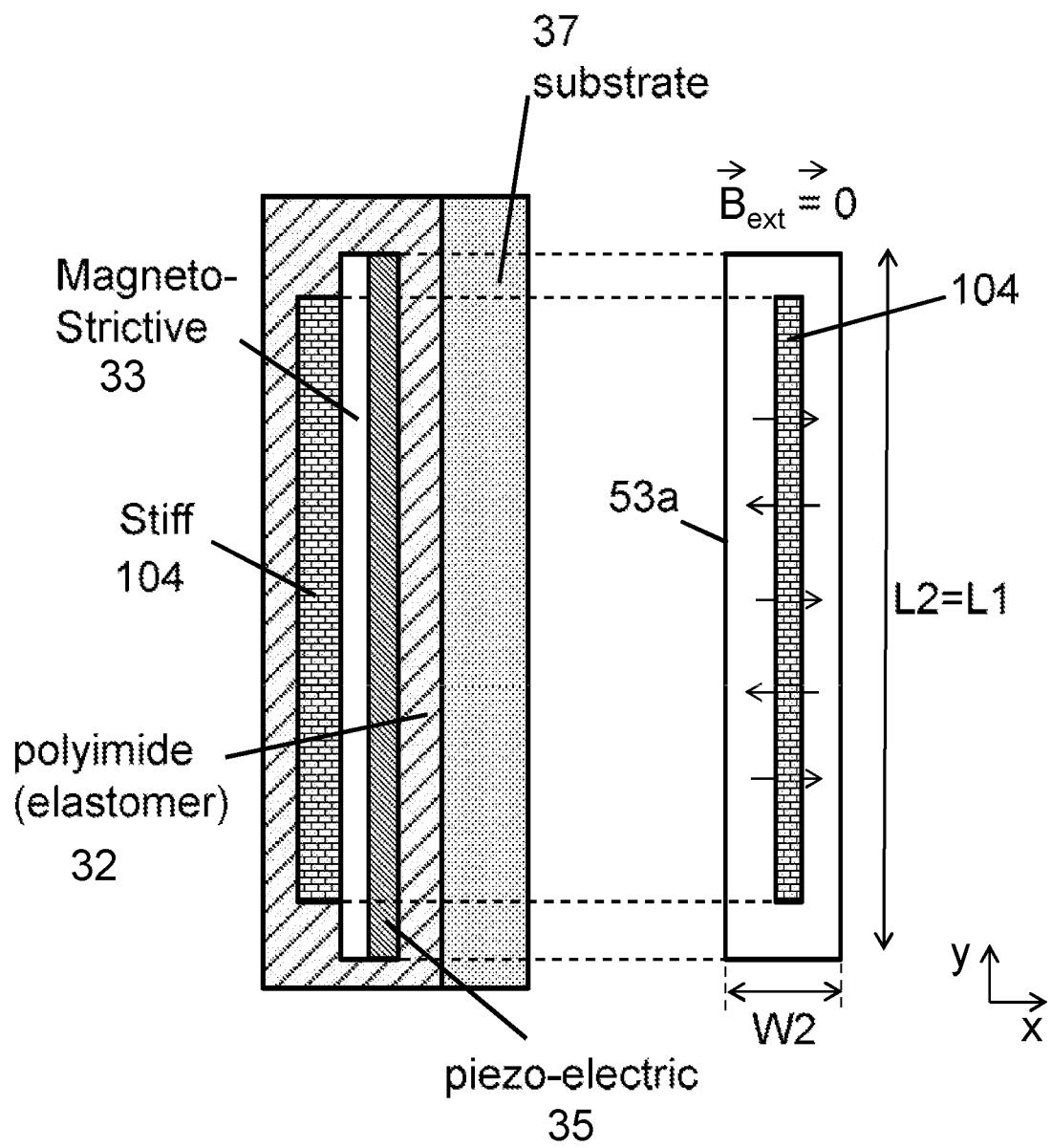

FIG. 11 is another variant of the structure of FIG. 8, where a stiff elongated element (different from the substrate and different from the package) is mechanically connected to the magnetostrictive strip, e.g. deposited thereon. With "stiff" is meant that the E-modulus of the elongated element is at least a factor 1.20 higher than the E-modules of the magnetostrictive material, for example at least a factor 1.50 or at least a factor 2.0. This has the effect that the structure has a higher mechanical stiffness (i.e. has a higher Young-modules) in the longitudinal direction of the elongated element, and a smaller mechanical stiffness (i.e. has a smaller E-modulus) in a transverse direction. The elongated material can for example be made of a material selected from the group consisting of copper, gold, platinum, molybdenum, nickel, but the present invention is not limited hereto, and other suitable metal or metal alloy, or even the piezoelectrical-material itself may be used, provided it has a higher stiffness than the magnetostrictive material.

In a variant of FIG. 11, the "stiff element" is a small zone of the substrate 37, which can be made by making an elongated opening in the elastomer layer 32 before depositing magnetostrictive material on top of said elastomer layer. In this case the stiff element 104 on the opposite side of the magnetostrictive layer 33 can be omitted.

In yet another variant of FIG. 11, both the stiff elongated element 104 is present, and the magnetostrictive layer 33 is in direct contact with the substrate 37 over a relatively narrow elongated zone. This reduces the material movement in the Y-direction even more.

FIG. 12 shows an example of a passive magnetoelectric transducer structure "ME1" comprising a plurality of "N" magnetoelectric rectangular elements 1101, 1102, etc., as can be used in embodiments of the present invention. The magnetoelectric elements are connected electrically in series, i.e. the first electrode 36 of one element is connected to the second electrode 34 of an adjacent element, etc., so as to form a chain. The total voltage between the nodes N1 and N2 thus obtained is substantially equal to the number of elements N multiplied by the individual voltage. In this way the gate voltage of the switch SW1 can be further increased.

Figure 13:
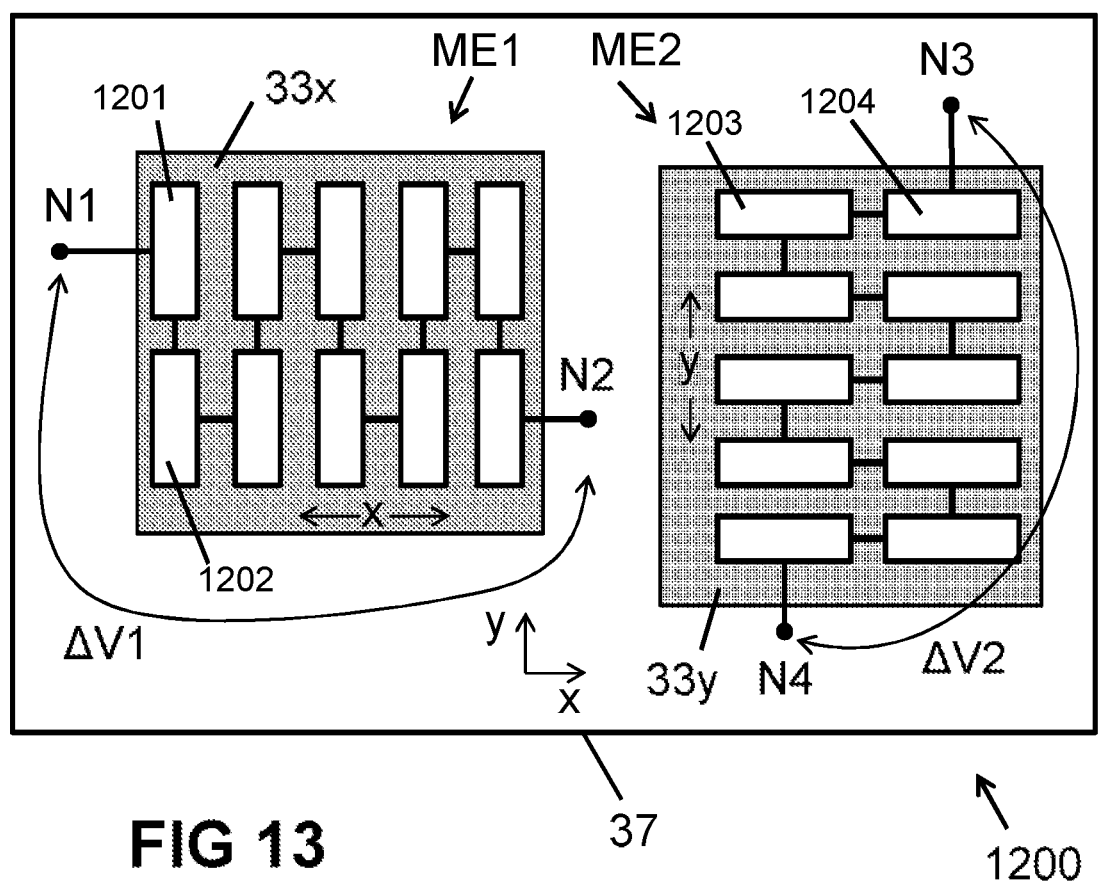
FIG. 13 shows an example of a device according to an embodiment of the present invention. The device comprises (left of FIG. 13) a first passive magnetoelectric transducer structure like the one shown in FIG. 12 where the magnetostrictive material has a preferential magnetization along the X axis, and a second passive magnetoelectric transducer structure (right of FIG. 13) like the one shown in FIG. 12, but where the magnetostrictive material has a preferential magnetization along the Y axis.

FIG. 13 shows an example of a device 1200 comprising:
a substrate 37 which may furthermore comprise a semiconductor switch (not explicitly shown), but that is not absolutely required, and the switch may also be located on another die but which is also part of the semiconductor device;
a first passive magnetoelectric transducer structure ME1 like the one shown in FIG. 12 comprising a magnetostrictive material 33x that has a preferential magnetization along the X axis, and comprising at least one, preferably a plurality of piezoelectric elements 1201, 1202 connected in series and extending in the Y-direction, for providing a first voltage difference $\Delta V1$ over the nodes N1 and N2 thereof, when a magnetic field having a field component in the Y-direction is approaching or is proximate to the device 1200;
a second passive magnetoelectric transducer structure ME2 similar to the one shown in FIG. 12, but comprising a magnetostrictive material 33y that has a preferential magnetization along the Y axis, and comprising at least one, preferably a plurality of piezoelectric elements 1203, 1204 connected in series and extending in the X-direction, for providing a second voltage difference $\Delta V2$ over the nodes N3 and N4 thereof, when a magnetic field having a field component in the Y-direction is approaching or is proximate to the device 1200;
and additional circuitry (not shown in FIG. 13, but see for example FIG. 15 to FIG. 20) for combining the voltage signals $\Delta V1$, $\Delta V2$ and for routing them to the control terminal of the switch, e.g. semiconductor switch, e.g. to the gate of the FET.

When implemented on a single die, ME1 can for example be magnetized in the X-direction and ME2 in the Y-direction by rotational magnetic field annealing, where magnetization will attain the longest direction. Another solution is to anneal in the presence of a magnetic field oriented at 45° relative to the X- and Y-axis. Yet another solution is to implement the first and second magnetoelectric structures ME1 and ME2 on different dies, and combining them.

Although the structure 33x and 33y are shown at 90°, that is not absolutely required, and another angle in the range from 45° to 135°, or from 75° to 105° could also be used.

For completeness it is mentioned that magnetisation at such as small scale can be achieved for example by applying a magnetic concentrator before or during annealing, which magnetic concentrator is stripped afterwards. Alternatively annealing can be performed in a rotating magnetic field, in which case the induced magnetisation will be along the long side of the structure, since during the annealing the magnetisation will tend towards the long axis.

Figure 14:
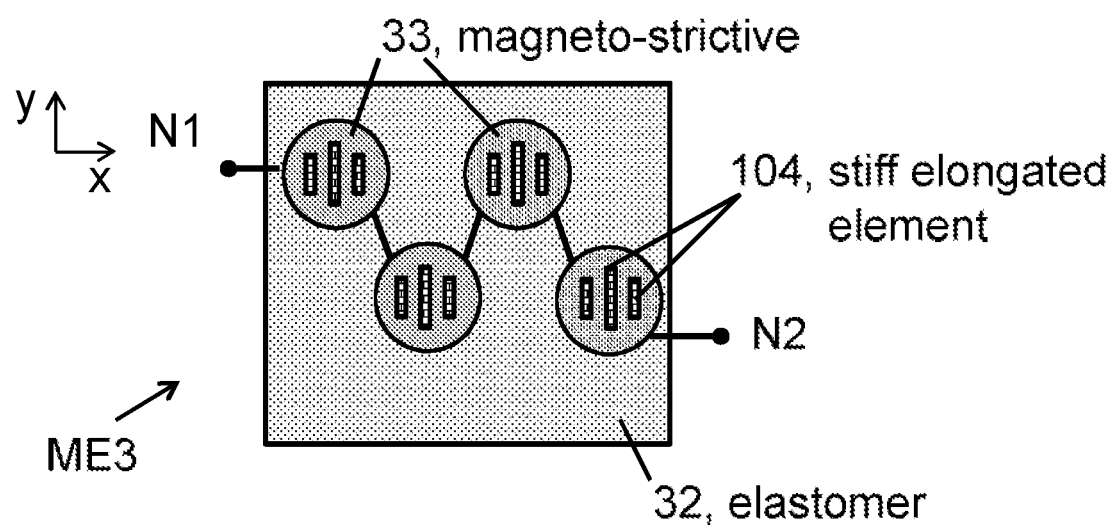
FIG. 14 shows a variant of the structure of FIG. 12, where several "magnetostrictive islands with a non-uniform stiffness" are mounted on an elastomer layer, and are interconnected.

FIG. 14 shows another example of a passive magnetoelectric transducer structure ME3, which can be seen as a variant of the magnetoelectric transducer structure of FIG. 12, but using one or more "stiff elongated elements" located on top of or underneath the magnetostrictive layer 33, but in direct mechanical contact thereto, as discussed and illustrated in relation to FIG. 11.

Figure 15:
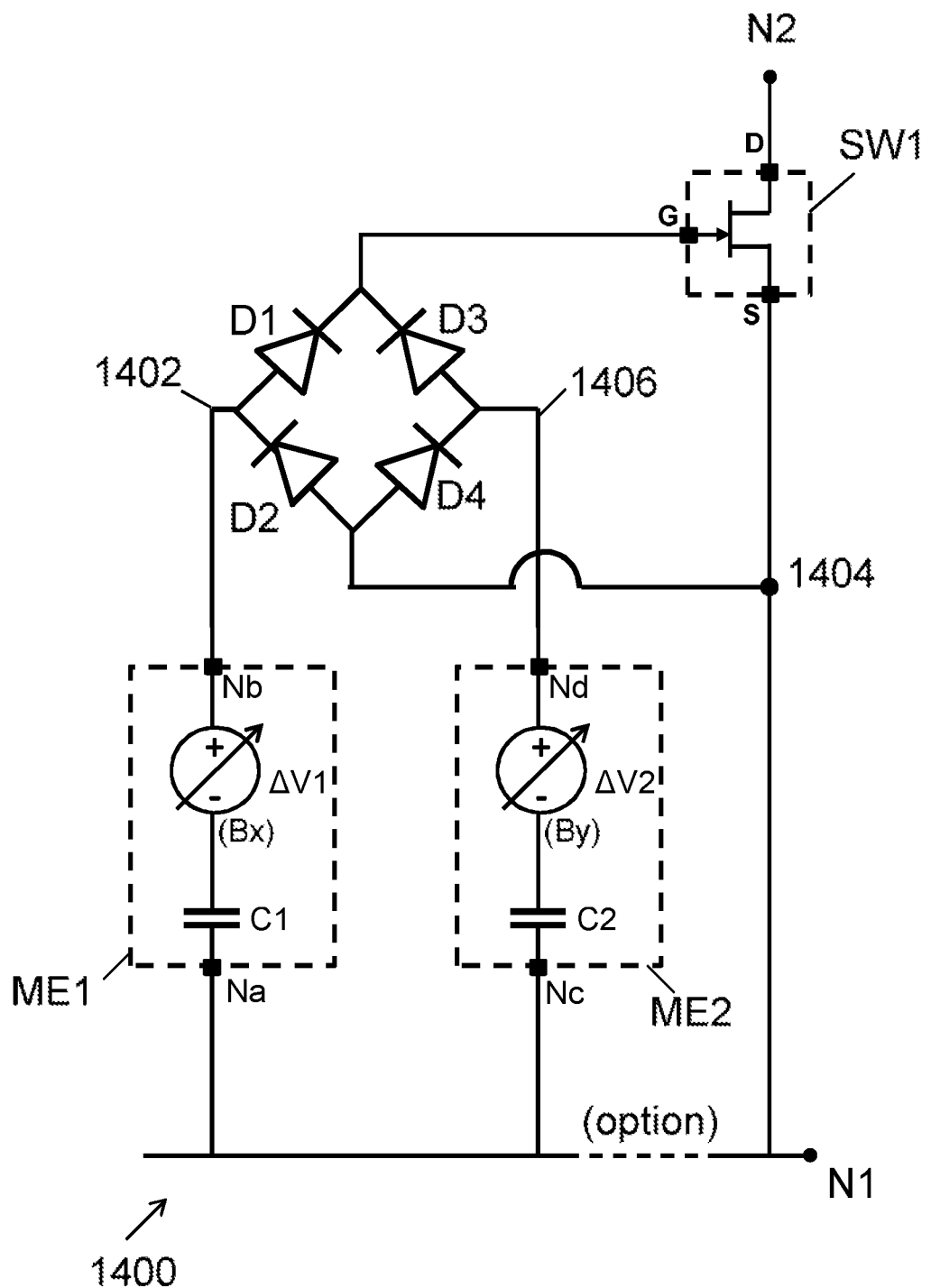
FIG. 15 is an electrical block diagram of a device according to an embodiment of the present invention, comprising a first and a second transducer structure as illustrated in FIG. 12 or FIG. 13, and further comprising four diodes and a FET.

FIG. 15 is an exemplary block diagram of a device 1400 comprising for example the first and a second transducer structure shown in FIG. 13, represented by their equivalent electrical circuit comprising a voltage source $\Delta V1$, $\Delta V2$ in series with a capacitance C1, C2, the latter being related to the first and second electrode 36, 34 being arranged at a small distance. In the drawing an indication "(Bx)" and "(By)" is provided to indicate for which magnetic field component each "voltage source" is sensitive. As can be seen, the device 1400 further comprises four diodes D1-D4, arranged to function as a rectifier circuit. The four diodes are preferably embedded in the same substrate where the FET is preferably embedded, for example a CMOS substrate.

Figure 16:
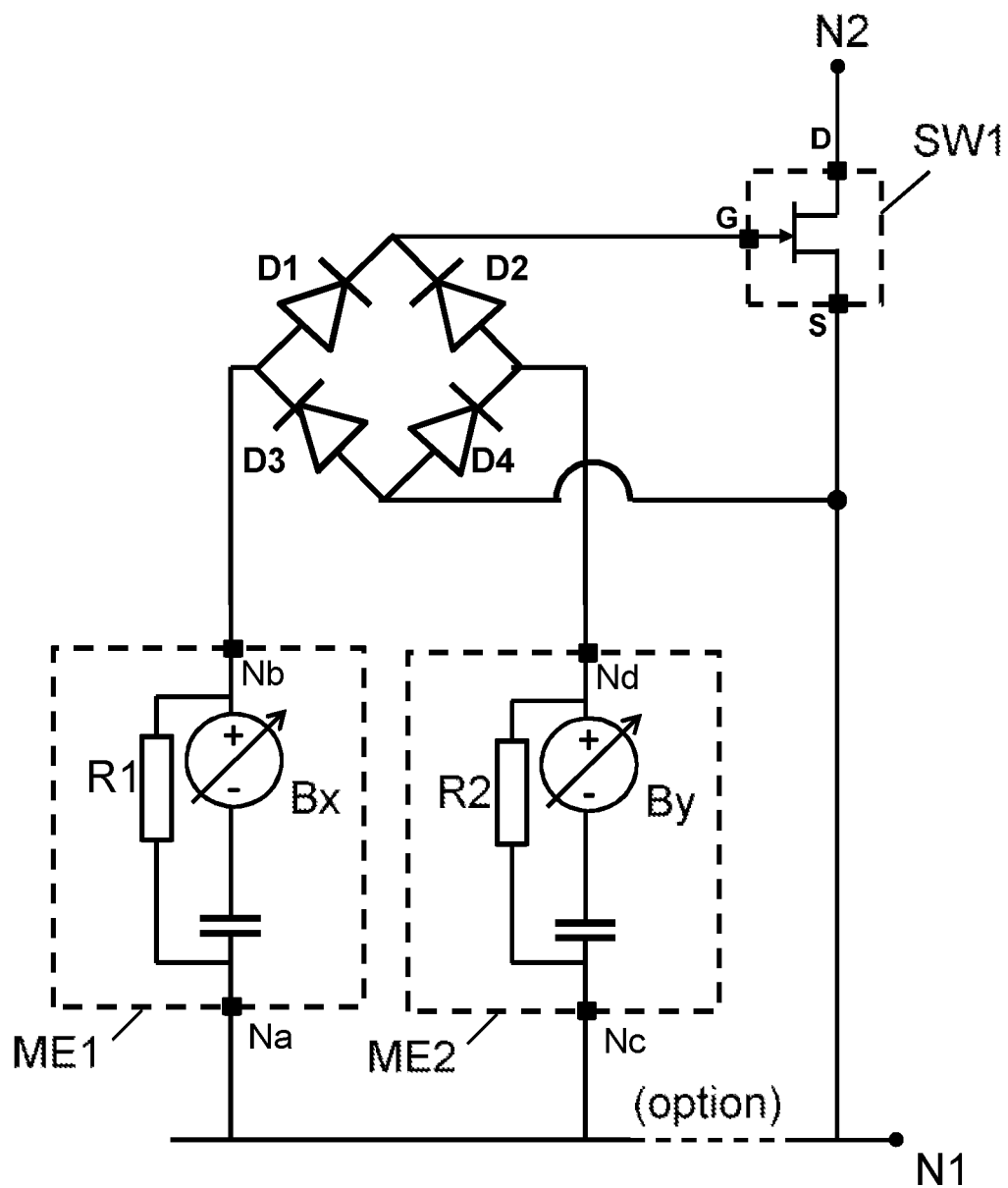
FIG. 16 is a variant of the circuit of FIG. 15, further comprising two resistors for discharging the first and second magnetoelectric transducer structure.

FIG. 16 shows a block-diagram of a device 1500, which can be seen as a variant of the circuit of FIG. 15, further comprising two resistors R1, R2 for deliberately discharging the first and second magnetoelectric transducer structure ME1, ME2. As is known in the art, the parallel connection of a capacitance C and a resistance R discharge in an exponential manner, according to a time constant $\tau = R \times C$. When choosing relatively small values for R1 and R2, the voltage signal(s) created by an approaching magnet, will be dissipated relatively fast, hence the switch SW1 will only be open for a relatively short period. When choosing relatively large values for R1 and R2, the voltage signal created by an approaching magnet, will remain present longer, so that the switch SW1 will be closed longer. The skilled person can find suitable values for R1 and R2 depending on the application.

For example, if the circuit of FIG. 16 is used as a passive "wake-up circuit" for an application, which for example only gets power when the first switch SW1 is closed, for example from an external power supply, e.g. from a battery (not shown), that application can for example provide additional circuitry for "taking over" via another switch (not shown), so that the actual circuit receives sufficient power for doing its task. When the application is done with its task, it can for example disconnect its local switch, and wait until it is woken-up the next time by the circuit shown in FIG. 16.

Figure 17:
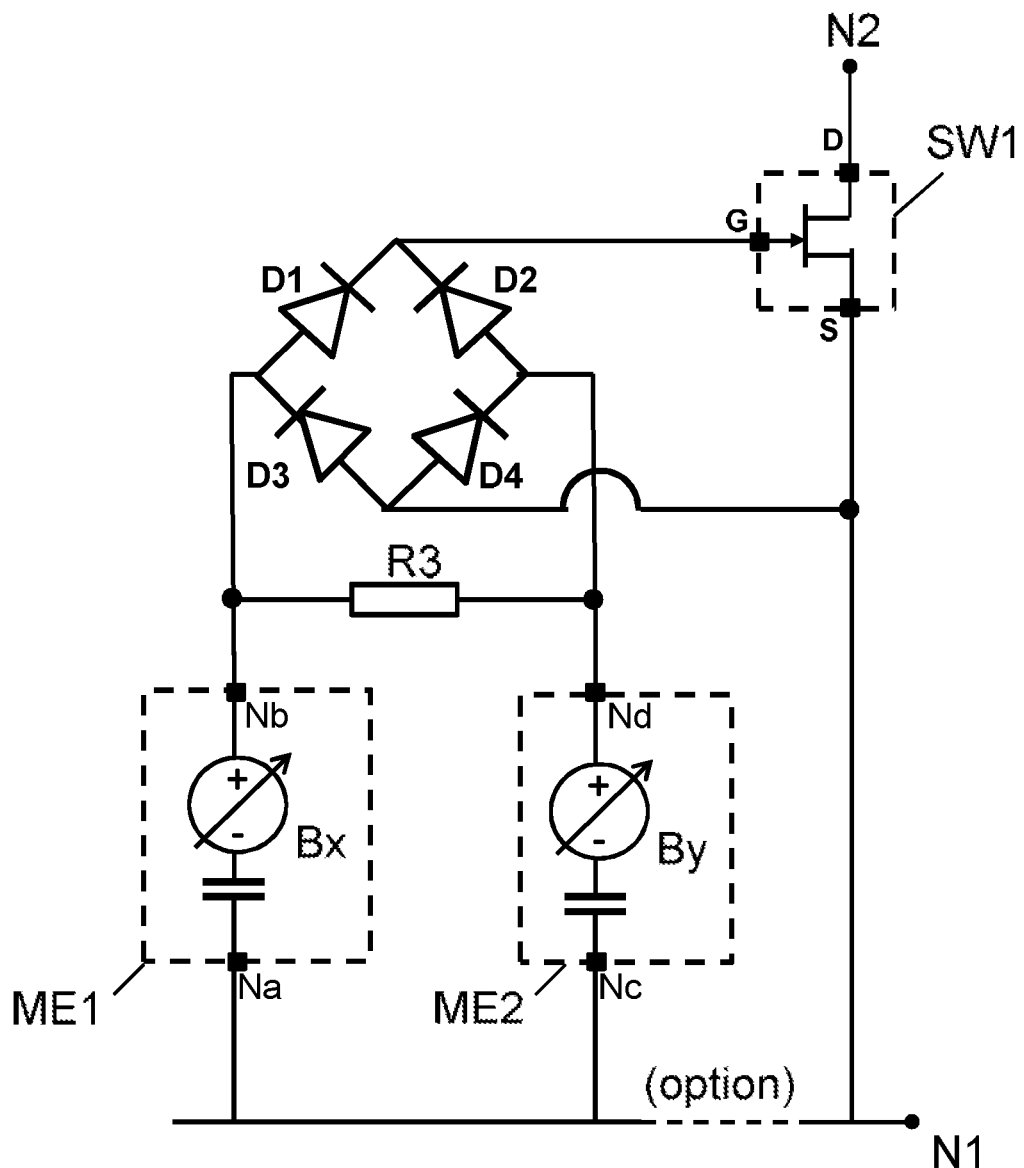
FIG. 17 is another variant of the circuit of FIG. 15, further comprising one resistor for discharging the first and second magnetoelectric transducer structure.

FIG. 17 shows a block-diagram of a device 1600, which can be seen as a variant of the circuit of FIG. 16, not comprising R1 and R2, but comprising R3 instead. The resistor R3 is connected between node Nb of the first magnetoelectric transducer ME1 and node Nd of the second magnetoelectric transducer ME2, and is also provided for the purpose of discharging the circuit. Again, depending on the value of R3, the discharge can happen relatively fast or relatively slow. The skilled person can find suitable values for R3 depending on the application.

Figure 18:
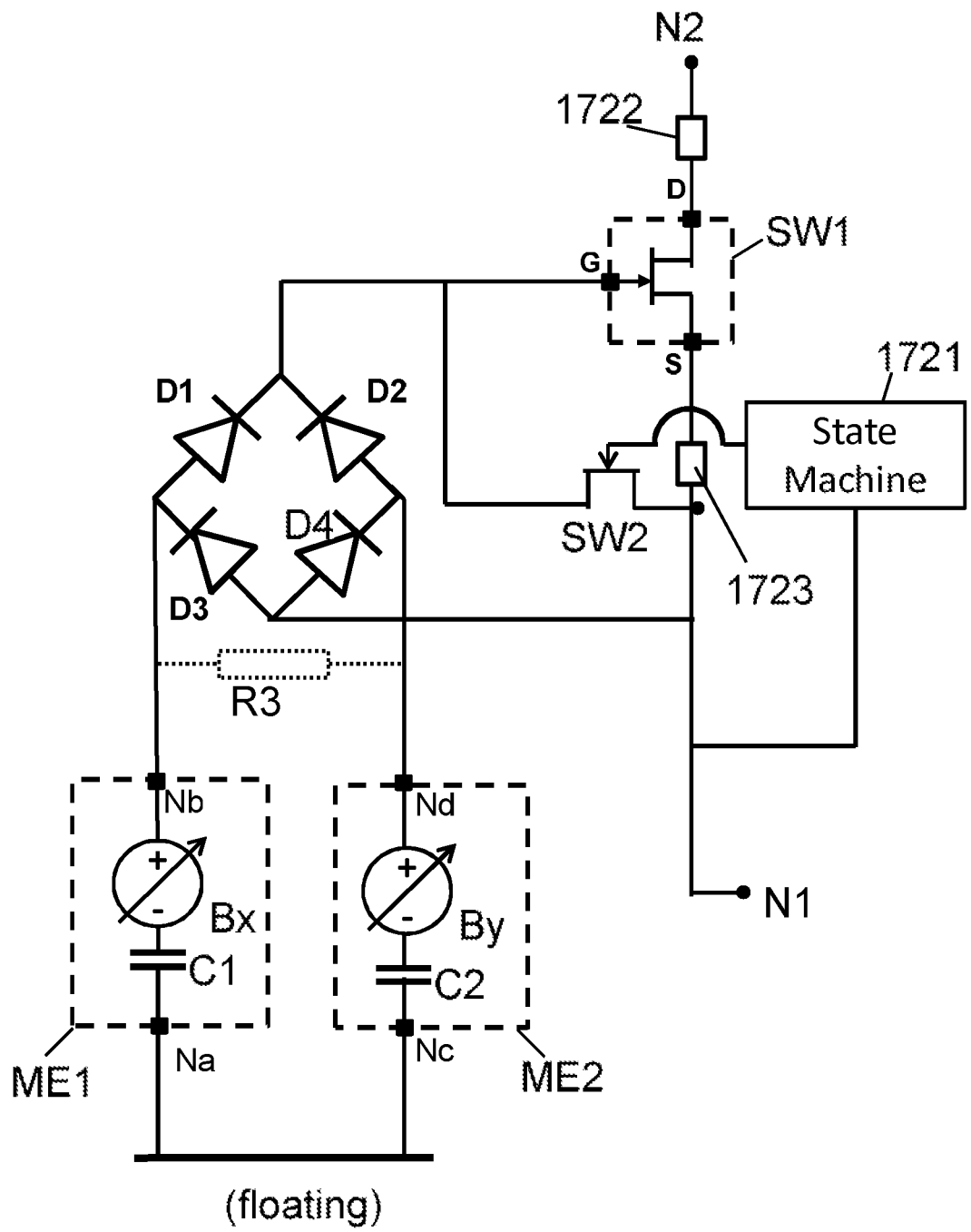
FIG. 18 is another variant of the circuit of FIG. 15, further comprising a state-machine and a second switch.

In each of the devices 1400, 1500, 1600 of FIG. 15 to FIG. 17, the nodes Na and Nc are interconnected, and are optionally but not necessarily connected to node N1. As shown in FIG. 18, the nodes Na and Nc may also be connected to each other, but left floating. The latter offers the advantage of temperature compensation, because both voltage sources would provide a same or similar charge increase due to temperature variations.

Referring back to FIG. 18, apart from showing that the nodes Na and Nc can be left floating, FIG. 18 shows a block-diagram of a device 1700 that furthermore comprises a state-machine 1721 and a second switch SW2, and optional further resistors 1722, 1723.

One purpose of this drawing is to show that the nodes Na and Nc need not necessarily be connected directly to the source or drain of the switch SW1, and it suffices to connect them together, but leave them floating.

Another purpose of this drawing is to show that it is possible to explicitly "reset" the first switch SW1 for example by means of a state-machine 1721 and a second switch SW2. The state-machine 1721 may for example implement a count-down counter counting at a predefined clock frequency when active, and may be adapted for being preset and keeping the switch SW2 open when the circuit 1721 wakes up when the first switch SW1 is being closed, and adapted for counting down subsequently, and for closing the switch SW2 when the counter reaches a predetermined value, e.g. zero, thereby connecting the gate "G" of the first switch SW1 to the source "S" of the first switch SW1 to open the switch SW1. In this way, the switch SW1 can be opened a predefined time after being closed, without having to rely on an RC-constant. When the switch SW2 is closed, the capacitors C1 and C2 of the magnetoelectric stacks are also discharged. Resistor R3 is optional.

Figure 19:
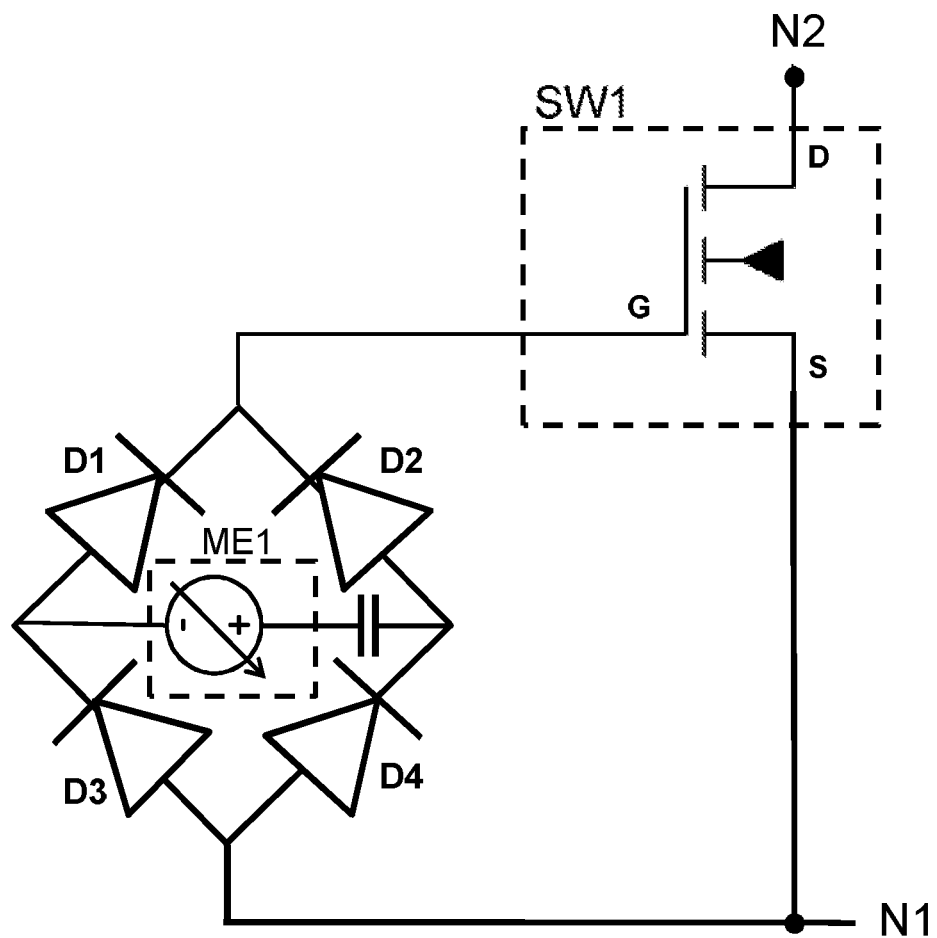
FIG. 19 shows another variant of the circuit of FIG. 15 comprising only one magnetoelectric transducer structure and a switch.

If no temperature compensation is required, a structure as shown in FIG. 19, comprising a single MagnetoElectric structure ME can also be used.

Figure 20:
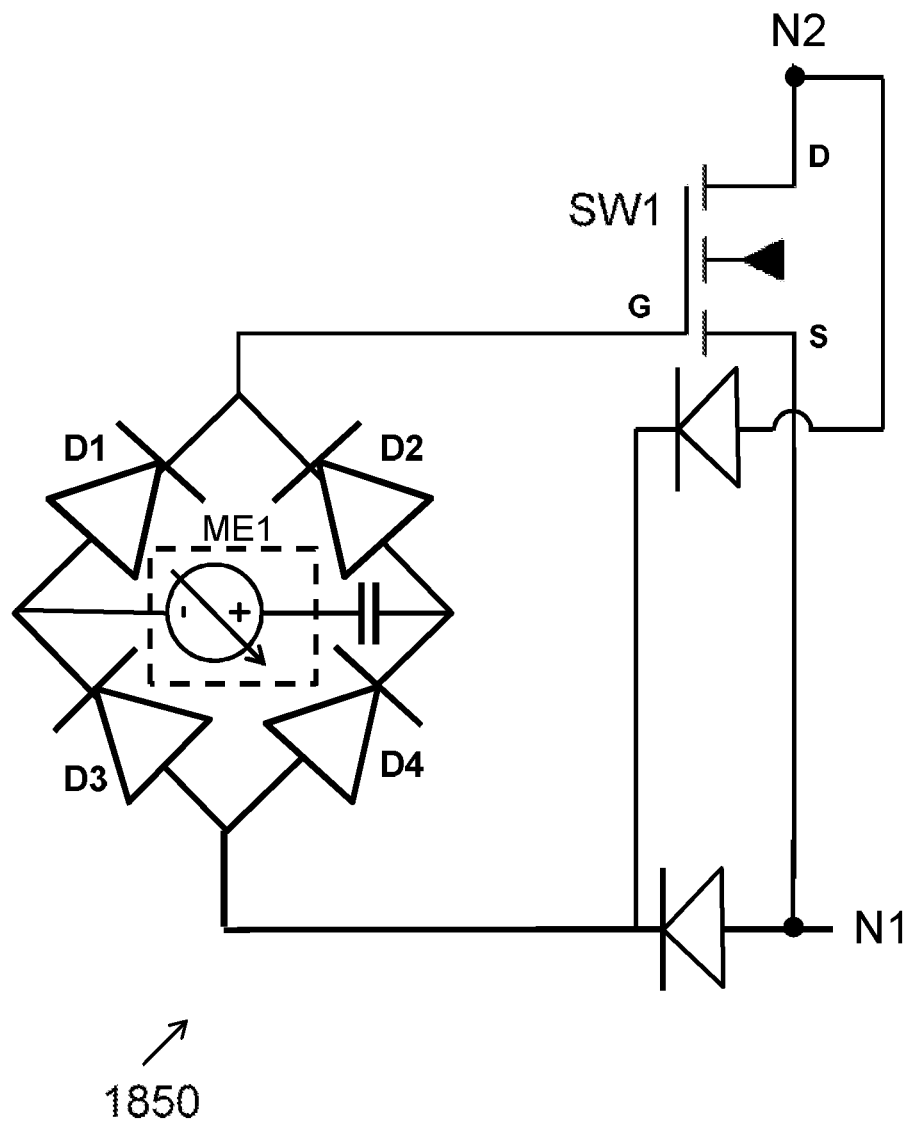
FIG. 20 shows a variant of the circuit of FIG. 19 having two additional diodes.

FIG. 20 shows a variant of the circuit of FIG. 19 having two additional diodes.

Figure 21:
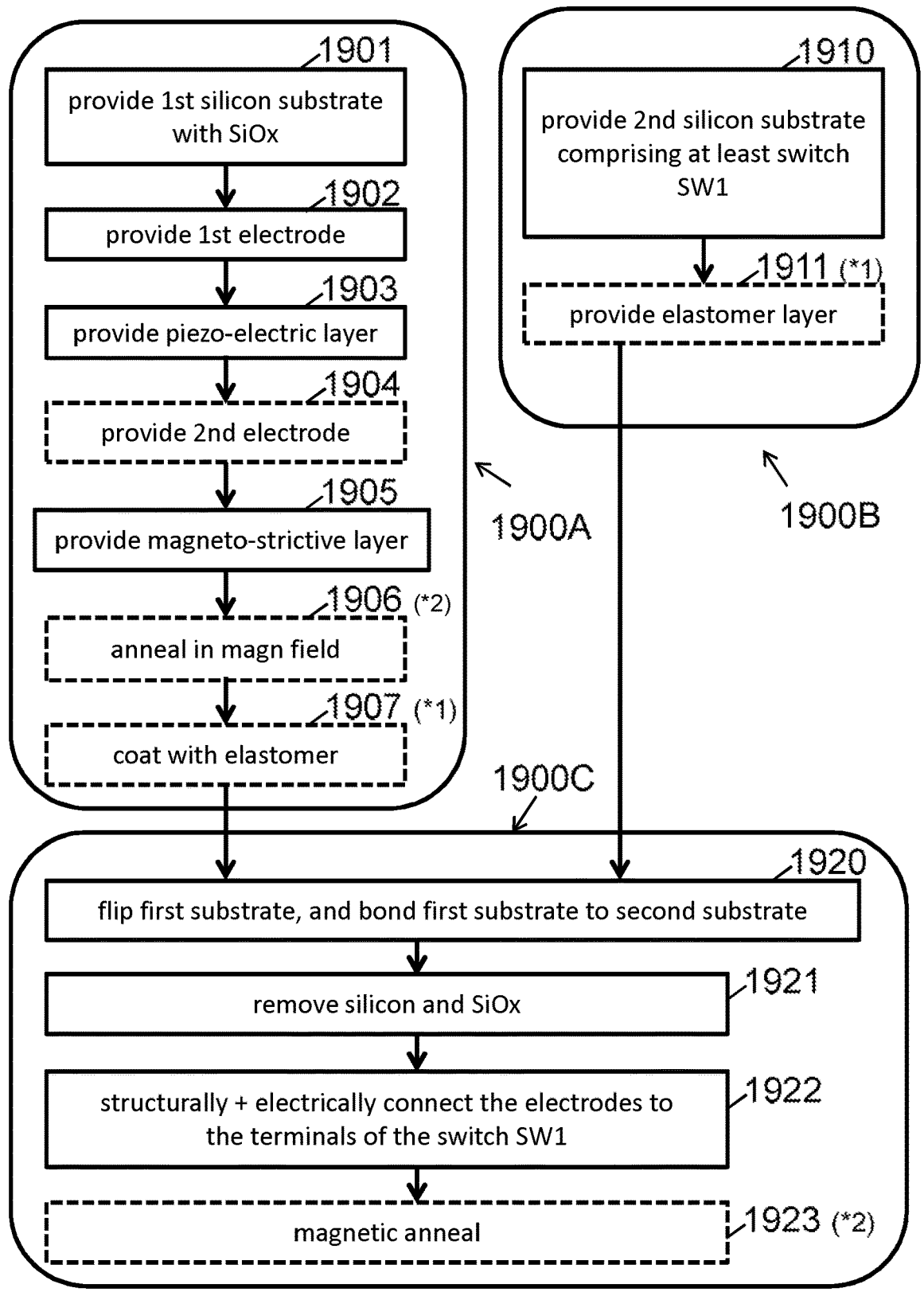
FIG. 21 is a flowchart illustrating a method of making a magnetoelectric transducer structure like to ones shown in FIG. 3 to FIG. 5, according to an embodiment of the present invention.

FIG. 21 is a flowchart illustrating a method 1900 of making a device according to the present invention. The method comprises three groups of steps.

The first group of steps, group 1900A, comprises the steps of:
providing 1901 a first silicon substrate 31 comprising an Si-oxide layer 32. As is well known, a silicon substrate oxidizes automatically, hence, no special action is required for providing the oxide-layer;
providing 1902 a first electrode 36 on top of the Si-oxide layer 32, for example by sputtering Pt or Mo;
providing 1903 a piezoelectric layer 35 on top of the first electrode 36, for example by sputtering AlN;
optionally providing 1904 a second electrode 34 on top of the piezoelectric layer, for example by sputtering Mo;
providing 1905 a magnetostrictive layer 33 on top of the second electrode 34, or directly on top of the piezoelectric layer 35, for example by sputtering FeGa or FeCo.

Figure 22A:
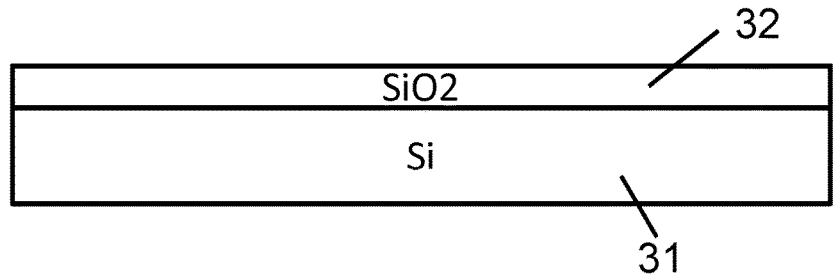
Figure 22B:
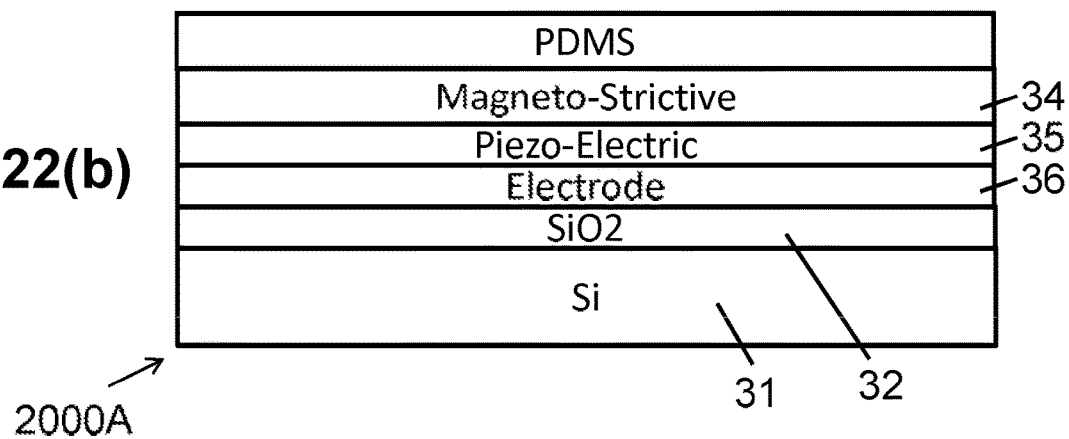
Figure 22C:
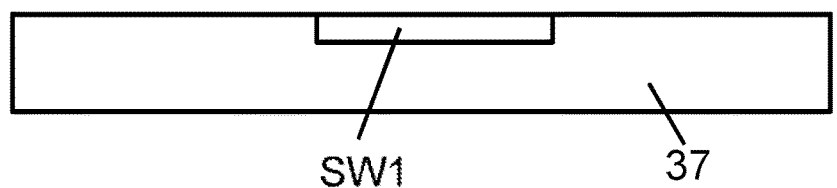

FIG. 22(b) shows an example of a stack 2000A produced by this sequence of steps.

The method 1900 may further comprise the optional step 1906 of annealing the stack 2000A in the presence of a constant magnetic field oriented in the X-axis.

The method 1900 may further comprise an optional step 1907 of coating the stack with an elastomer. The stack can be further shaped or structured after bonding.

The second group of steps, group 1900B, comprises the steps of:
providing 1910 a second silicon substrate 37 comprising at least one switch SW1, for example a CMOS substrate comprising a FET, e.g. a MOSFET, and optionally further comprising more embedded resistors and/or embedded diodes, and optionally further comprising additional circuitry for example as discussed in FIG. 15 to FIG. 20;
and an optional step 1911 of providing an elastomeric layer 38, e.g. a PDMS or a polyimide-layer on top of the second silicon substrate.

Figure 22D:
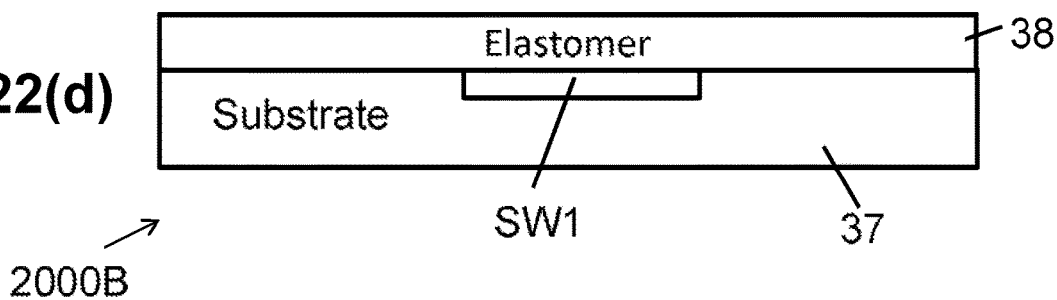

FIG. 22(d) shows an example of a substrate 2000B produced by this sequence of steps.

The third group of steps, group 1900C, comprises the steps of:
flipping 1920 the first substrate 2000A, and bonding the first substrate 2000A to the second substrate 2000B by means of one or more elastomeric layers, in such a way that the magnetoelectric layer 33 of the first substrate 2000A faces the elastomeric layer 38 of the second substrate 2000B;
removing 1921 the silicon 31 and silicon-oxide 32, for example by means of etching;
electrically connecting the nodes N1, N2, and optionally also N3, N4 of the first substrate 2000A, directly or indirectly (but in a functional manner), to at least one terminal of the switch SW1 embedded in the second substrate 2000B;
and an optional step 1923 of annealing the stack in the presence of a constant magnetic field.

FIGS. 22(e) and (f) illustrate the result of these steps.

One or both of the annealing steps 1906 and/or 1923 may be present.

At least one of the coating steps 1907 and/or 1911 is required.

The method 1900 may further include one or more of the following steps:
i) shaping or structuring of the top electrode,
ii) shaping or structuring of the piezoelectric layer and magnetostrictive layer,
iii) shaping or structuring of the bottom electrode,
iv) deposition of interconnect/bondpad metal,
v) shaping or structuring of metal.

Figure 23:
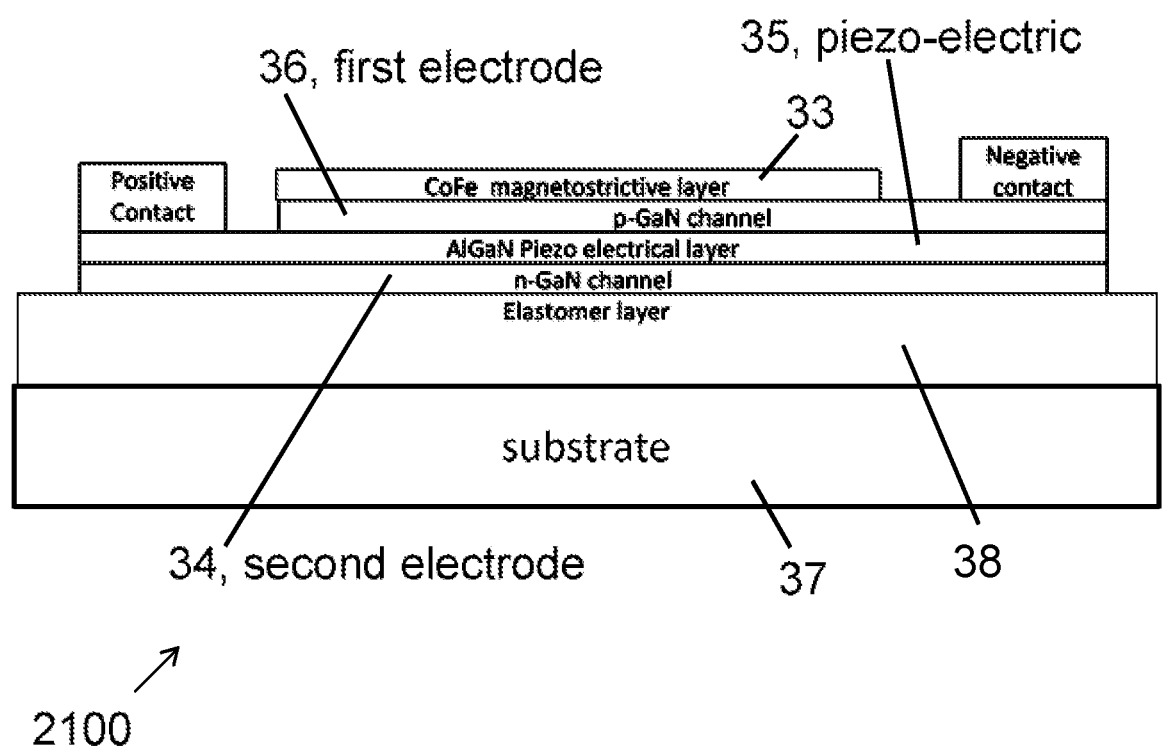
FIG. 23 shows a structure where a switch (e.g. a FET) and the magnetoelectrical transducer structure are integrated on a single substrate.

FIG. 23 shows a structure where a switch (e.g. a FET) and the magnetoelectrical transducer structure are integrated on a single substrate.

As can be seen, this device 2100 comprises a substrate 37; an elastomer layer 38 on top of the substrate;
a second electrode 34 on top of the elastomer layer 38, made of n-GaN channel;
a piezoelectric layer, in the example comprising AlGaN;
a first electrode 36 on top of the piezoelectric layer 35, made of p-GaN channel;
and a magnetostrictive layer 33, made of CoFe, preferably 50% Co and 50% Fe.

Optionally another elastomer layer may be deposited on top of the entire structure for reducing packaging stress.

The invention claimed is:

1. A semiconductor device comprising:
a passive magnetoelectric transducer structure adapted for generating a charge via mechanical stress caused by a magnetic field;
a semiconductor switch electrically connected to said passive magnetoelectric transducer structure, the switch having a first terminal and a second terminal and a control terminal, the switch being adapted for selectively electrically connecting and disconnecting its first and second terminal depending on a signal presented at the control terminal, the passive magnetoelectric transducer structure having a first terminal electrically connected to the control terminal of the switch;
a semiconductor substrate, wherein the switch is embedded in the semiconductor substrate; and an elastomer layer, wherein at least a portion of the passive magnetoelectric transducer structure is connected to the semiconductor substrate via the elastomer layer.

2. A semiconductor device of claim 1, wherein the passive magnetoelectric transducer structure has a second terminal electrically connected to the first terminal of the switch.

3. A semiconductor device according to claim 2, wherein the semiconductor switch is a Field Effect Transistor having a gate being the control terminal, and a source being the first terminal, and a drain being the second terminal;
or wherein the semiconductor switch is a Field Effect Transistor having a gate being the control terminal, and a source being the second terminal, and a drain being the first terminal.

4. A semiconductor device according to claim 1, wherein the magnetoelectric transducer structure is mounted to a substrate or arranged inside a package in such a way that the magnetoelectric transducer structure has a first stiffness or a first E-modulus in a first direction, and has a second stiffness or a second E-modulus in a second direction perpendicular to the first direction different from the first stiffness or first E-modulus.

5. A semiconductor device according to claim 1, wherein the magnetoelectric transducer structure is connected to a substrate by means of an elastic connection over a major portion of its surface area, and by means of an elongated strip having a length over width ratio of at least 2.0 over a minor portion of its surface area;
and/or wherein the magnetoelectric transducer structure is flexibly mounted to a substrate over a central portion of the transducer structure and fixedly connected to the substrate on at least two distinct locations for reducing mechanical expansion or contraction of the transducer structure between these locations when a magnetic field is applied;
and/or wherein the magnetoelectric transducer structure is flexibly mounted to a package over a central portion of the transducer structure and fixedly connected to the package on at least two distinct locations for reducing mechanical expansion or contraction of the transducer structure between these locations when a magnetic field is applied;
and/or wherein the semiconductor device further comprises an elongated element having a stiffness or an E-modulus higher than that of the magnetoelectric transducer structure, which elongated element is mounted to the transducer structure on at least two distinct locations for reducing mechanical expansion or contraction of the transducer structure between these locations when a magnetic field is applied.

6. The semiconductor device according to claim 1, wherein the passive magnetoelectric transducer structure comprises a magnetostrictive layer intimately mechanically coupled to a piezoelectric layer or piezoelectric element,
and optionally wherein the piezoelectric layer or piezoelectric element comprises a piezoelectric material selected from the group consisting of AlN, ZnO, AlScN, PZT and AlGaN;
and optionally wherein the piezoelectric layer comprises an elongated element having a stiffness or an E-modulus higher than that of the magnetoelectric transducer structure for reducing mechanical expansion or contraction of the piezoelectric layer in the longitudinal direction of the elongated element when a magnetic field is applied;
and optionally wherein the magnetostrictive layer comprises a magnetostrictive material selected from the group consisting of FeGa, FeCo, FeTb, FeCoSiB and FeCoB.

7. The semiconductor device according to claim 1, wherein the passive magnetoelectric transducer structure comprises a piezoelectric film with embedded magnetostrictive powder.

8. A semiconductor device according to claim 6, wherein the magnetostrictive material has a preferential magnetization along a first axis in the absence of an external magnetic field.

9. A semiconductor device according to claim 7, wherein the piezoelectric film with embedded magnetostrictive powder has a preferential magnetization along a first axis in the absence of an external magnetic field.

10. A semiconductor device according to claim 1, wherein the passive magnetoelectric transducer structure comprises a plurality of at least two piezoelectrical elements electrically connected in series and oriented in parallel with each other.

11. A semiconductor device according to claim 1, further comprising a second passive magnetoelectrical transducer structure comprising a second magnetostrictive layer intimately mechanically coupled to at least one second piezoelectric element, the second magnetostrictive layer comprising a second magnetostrictive material;
wherein the second magnetostrictive material has a preferential magnetization along a second axis different from the first axis in the absence of an external magnetic field.

12. A semiconductor device according to claim 1, comprising a first magnetoelectrical stack comprising a first magnetostrictive material having a positive magnetostriction, and
comprising a second magnetoelectrical stack comprising a second magnetostrictive material having a negative magnetostriction, and
the first and the second magnetoelectrical stack being connected in series and being oriented so as to have different directions of maximum sensitivity.

13. A semiconductor device according to claim 1, wherein the second passive magnetostrictive transducer structure comprises a plurality of at least two piezoelectrical elements electrically connected in series, each of these piezoelectrical elements being intimately mechanically coupled to the second magnetostrictive layer and being oriented in parallel with respect to each other, for providing a second voltage signal;
and wherein the device further comprises a passive electrical circuit for generating a differential signal between the first control signal and the second control signal.

14. A semiconductor device according to claim 1,
wherein the passive magnetoelectric transducer structure is mounted to the elastomer layer such that a magnetostrictive layer comprised in the passive magnetoelectric transducer structure is facing the elastomer layer.

15. Method of producing a semiconductor device according to claim 1, comprising the steps of:
providing a silicon substrate comprising an oxide layer on top of said silicon substrate;
providing a first electrode layer on top of said oxide layer;
providing a piezoelectric and magnetostrictive layer or structure;
optionally annealing the first substrate in the presence of a constant magnetic field;

providing a second substrate comprising at least one semiconductor switch having a first terminal and a second terminal and a control terminal;

providing an elastomer layer on top of the second substrate;

mounting the first substrate to the second substrate such that the piezoelectric and magnetostrictive layer or structure is facing the elastomer layer;

removing the silicon and the silicon oxide layer of the first substrate;

electrically connecting the first electrode to the first terminal of the switch, and electrically connecting the second electrode to the control terminal of the switch.

16. The method of claim 15, wherein the step of providing the piezoelectric and magnetostrictive layer or structure comprises the steps of:

i) providing a piezoelectric layer on top of said first electrode layer;

ii) optionally providing a second electrode layer on top of the piezoelectric layer;

iii) providing a magnetostrictive layer on top of the second electrode or directly on top of the piezoelectric layer, or wherein the step of providing the piezoelectric and magnetostrictive layer or structure comprises the step of:

iv) providing a piezoelectric layer comprising magnetostrictive powder, on top of said first electrode layer.

17. Use of a passive magnetoelectric transducer structure as specified in claim 1, for creating a control signal for opening or closing an integrated semiconductor switch without the need for an external power supply.

* * * * *